United States Patent
Jeong

(10) Patent No.: US 7,466,623 B2
(45) Date of Patent: Dec. 16, 2008

(54) PSEUDO SRAM CAPABLE OF OPERATING IN CONTINUOUS BURST MODE AND METHOD OF CONTROLLING BURST MODE OPERATION THEREOF

(75) Inventor: Duk Ju Jeong, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 321 days.

(21) Appl. No.: 11/321,465

(22) Filed: Dec. 30, 2005

(65) Prior Publication Data
US 2006/0268652 A1  Nov. 30, 2006

(30) Foreign Application Priority Data
May 30, 2005  (KR)  ............ 10-2005-0045664

(51) Int. Cl.
G11C 8/04 (2006.01)
G11C 8/18 (2006.01)
G11C 7/22 (2006.01)

(52) U.S. Cl. ........... 365/239; 365/238.5; 365/233.18; 365/233.1; 365/194; 711/217; 711/218; 711/219

(58) Field of Classification Search ........ 365/230.09, 365/239, 193, 238.5, 233.5, 233, 235, 203, 365/194, 233.1, 233.18; 345/570; 711/217, 711/218, 219
See application file for complete search history.

(56) References Cited

U.S. PATENT DOCUMENTS

| 5,754,838 A | * | 5/1998 | Shibata et al. ............. 713/600 |
| 5,829,026 A | * | 10/1998 | Leung et al. ............. 711/122 |
| 5,835,952 A | * | 11/1998 | Yamauchi et al. .......... 711/157 |
| 5,930,523 A | * | 7/1999 | Kawasaki et al. .......... 712/32 |
| 6,154,409 A | | 11/2000 | Huang et al. |
| 6,285,578 B1 | | 9/2001 | Huang |
| 6,510,097 B2 | * | 1/2003 | Fukuyama ............ 365/230.03 |
| 6,792,493 B2 | | 9/2004 | Matsui et al. |
| 6,859,415 B2 | | 2/2005 | Takatsuka et al. |
| 6,879,537 B2 | | 4/2005 | Takahashi et al. |
| 2002/0147885 A1 | | 10/2002 | Mobley |
| 2003/0149821 A1 | | 8/2003 | Matsui et al. |
| 2005/0068837 A1 | | 3/2005 | Takeuch et al. |
| 2005/0068843 A1 | | 3/2005 | Takeuchi |
| 2005/0105380 A1 | * | 5/2005 | Takahashi et al. .......... 365/233 |

FOREIGN PATENT DOCUMENTS

| JP | 2001-035149 | 2/2001 |
| JP | 2002-184174 | 8/2002 |
| KR | 1020040009508 | 1/2004 |
| TW | 584859 | 4/2004 |

OTHER PUBLICATIONS

Office Action for Taiwan patent app. 95100710.

\* cited by examiner

*Primary Examiner*—J. H. Hur
(74) *Attorney, Agent, or Firm*—Lowe Hauptman Ham & Berner, LLP

(57) ABSTRACT

A pseudo SRAM which can perform read and write operations of data in a continuous burst mode in such a manner that it continuously generates burst row and column address signals, which gradually rise, based on external address signals that have already been received until new external address signals are received.

60 Claims, 17 Drawing Sheets

PSEUDO SRAM CAPABLE OF OPERATING IN CONTINUOUS BURST MODE AND METHOD OF CONTROLLING BURST MODE OPERATION THEREOF

BACKGROUND

1. Field of the Invention

The present invention relates to semiconductor memory devices and more particularly, to pseudo Static Random Access Memory (SRAM) and operation control methods thereof.

2. Discussion of Related Art

Semiconductor memory devices include SRAM and a Dynamic Random Access Memory (DRAM). SRAM is advantageous in that it does not need a refresh operation for data retention since it has memory cells of a latch structure and has a fast operation speed and low power consumption in comparison with DRAM. SRAM is, however, disadvantageous in that it is larger in size than DRAM and is expensive, due to the area occupied by the memory cells of the latch structure.

Meanwhile, DRAM includes memory cells, each having one transistor and one capacitor. Since a leakage current is generated in the memory cells constructed above, data stored in DRAM memory cells is lost due to the leakage current as times goes by. Therefore, DRAM is disadvantageous in that it must perform a refresh operation periodically in order to retain data. Furthermore, DRAM has an operating speed slower than that of SRAM and has high power consumption than SRAM. However, since DRAM includes memory cells having an occupation area smaller than that of SRAM, it is advantageous in terms of integration level and price in comparison with SRAM.

Recently, as the level of integration of semiconductor memory devices becomes higher and there is a need for a higher speed, semiconductor memory devices of a high performance, which have only advantages of SRAM and DRAM, such as pseudo SRAM, have been developed by implementing SRAM using DRAM cells. Pseudo SRAM is a semiconductor memory device including memory cells having DRAM cell structure and peripheral circuits of SRAM. In pseudo SRAM, an additional SRAM cache memory continuously performs the read and write operations of data even when DRAM cells perform the refresh operation. Therefore, pseudo SRAM operates in a similar way as SRAM by hiding the refresh operation of the DRAM cells externally.

Pseudo SRAM in the related art, however, does not support a burst mode of reading or writing data in burst in response to one access command. Therefore, pseudo SRAM in the related art can perform read or write operation of data on only memory cells connected to one word line in response to one access command. As a result, a problem arises because the related art pseudo SRAM has to receive corresponding new external address signals whenever word lines that should be enabled in order to perform the read or write operation are changed.

SUMMARY OF THE INVENTION

An advantage of the present invention is that it provides pseudo SRAM which can perform read and write operations of data in a continuous burst mode in such a manner that it continuously generates burst row and column address signals, which gradually rise, based on external address signals that have already been received until new external address signals are received.

Another advantage of the present invention is that it provides a method of controlling a burst mode operation of pseudo SRAM, in which the read and write operations of data can be performed in continuous burst mode in such a manner that burst row and column address signals, which gradually rise, are continuously generated based on external address signals that have already been received until new external address signals are received.

In one embodiment the pseudo SRAM according to an aspect of the present invention may include a memory cell array, a burst mode controller, a read and write controller, a row decoder, a word line driver and a column decoder. The memory cell array may include a plurality of DRAM cells. The burst mode controller receives external address signals in response to an external clock signal and external control signals, continuously generates burst row address signals and burst column address signals based on the external address signals, and generates a burst operation control signal and a word line control signal in response to the external control signals, a precharge control signal and latency control signals. The read and write controller generates a driver control signal in response to the word line control signal and the precharge control signal. The row decoder decodes the burst row address signals. The word line driver enables one of word lines of the memory cell array, which corresponds to the result decoded by the row decoder or disables some or all of the word lines of the memory cell array, in response to the driver control signal. The column decoder receives the burst column address signals in response to the burst operation control signal and enables bit lines of the memory cell array, which correspond to the burst column address signals.

A method of controlling a burst mode operation of pseudo SRAM according to another aspect of the present invention may include the steps of: 1) receiving external address signals in response to an external clock signal and external control signals, 2) continuously generating burst row address signals and burst column address signals that gradually rise from the external address signals, 3) generating a burst operation control signal and a word line control signal in response to the external control signals, a precharge control signal and latency control signals, 4) generating a driver control signal in response to the word line control signal and the precharge control signal, 5) decoding the burst row address signals, 6) enabling one of the word lines of a memory cell array, which corresponds to the decoded result, in response to the driver control signal, 7) receiving the burst column address signals in response to the burst operation control signal, 8) enabling bit lines of the memory cell array, which correspond to the burst column address signals.

DETAILED DESCRIPTION OF PREFERRED EMBODIMENTS

The present invention will now be described in connection with preferred embodiments with reference to the accompanying drawings.

Figure 1:
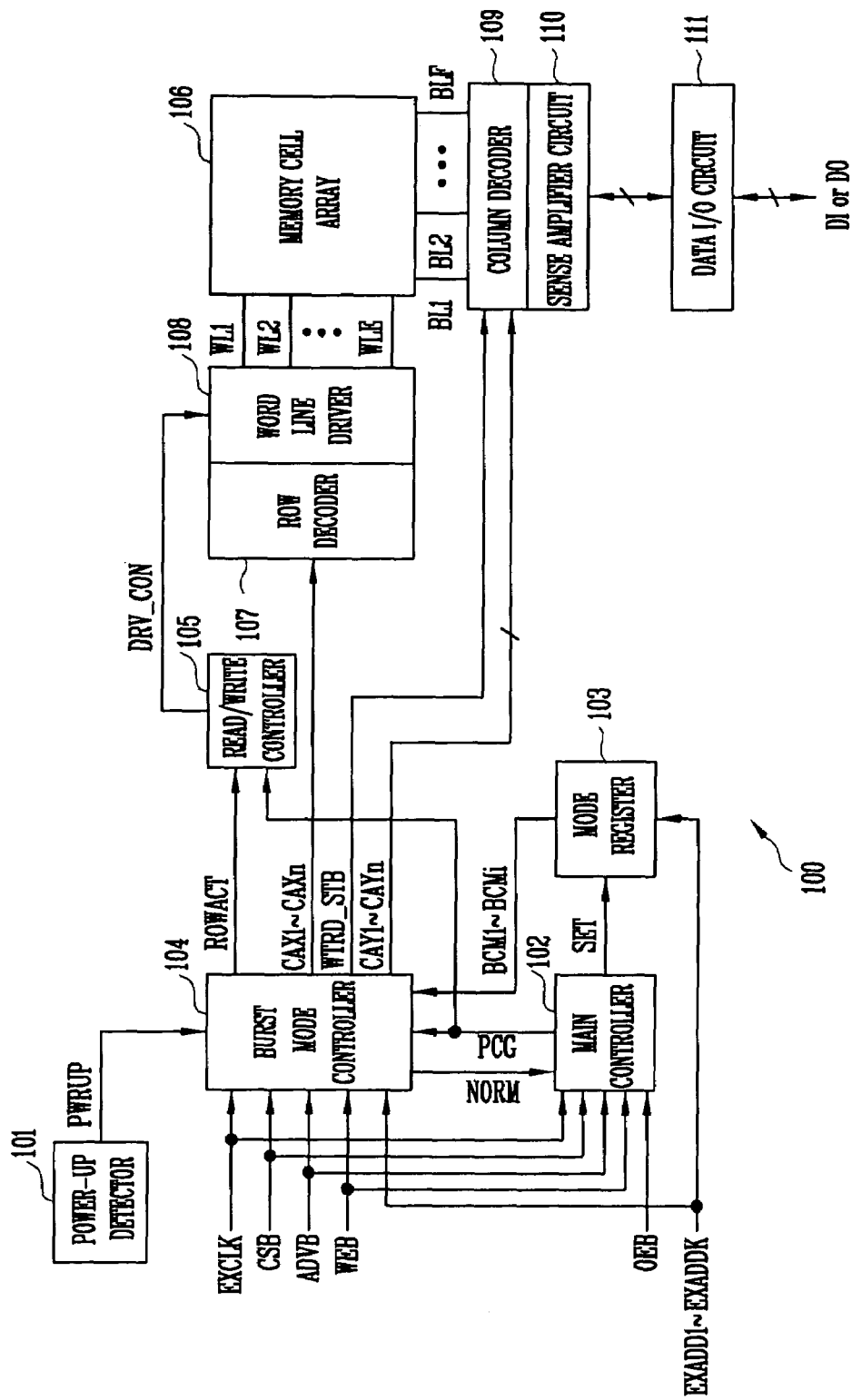
FIG. 1 is a block diagram of a pseudo SRAM according to an embodiment of the present invention.

FIG. 1 is a block diagram of a pseudo SRAM according to an embodiment of the present invention. FIG. 1 schematically shows parts related to burst operation of the pseudo SRAM.

Referring to FIG. 1, a pseudo SRAM 100 includes a power-up detector 101, a main controller 102, a mode register 103, a burst mode controller 104, a read/write controller 105, a memory cell array 106, a row decoder 107, a word line driver 108, a column decoder 109, a sense amplifier circuit 10 and a data I/O circuit 111.

The power-up detector 101 senses that an external power supply voltage becomes a set voltage and generates a power-up detection signal (PWRUP). The power-up detector 101 outputs the power-up detection signal (PWRUP) as logic high when an external power supply voltage becomes a set voltage (i.e., when the pseudo SRAM 100 is enabled) and outputs the power-up detection signal (PWRUP) as logic low when the pseudo SRAM 100 is disabled.

The main controller 102 outputs a mode register setting signal (SET) in response to a chip select signal (CSB), an address valid signal (ADVB), a write enable signal (WEB) and an output enable signal (OEB), all of which are external control signals. Furthermore, the main controller 102 generates a precharge control signal (PCG) in response to an external clock signal (EXCLK), the chip select signal (CSB), the address valid signal (ADVB) and a first internal control signal (NORM). When the chip select signal (CSB) and the address valid signal (ADVB) are disabled to a low level, the main controller 102 generates the precharge control signal (PCG) as a high pulse signal after a set time elapses. Furthermore, the main controller 102 generates the precharge control signal (PCG) as a high pulse signal when the first internal control signal (NORM) becomes logic high.

The mode register 103 stores external address signals (EXADD1 to EXADDK) (K is an integer) in response to the mode register setting signal (SET) and outputs latency control signals (BCM1 to BCMi) (i is an integer) according to values set by the external address signals (EXADD1 to EXADDK). The term "latency" refers to information on a clock cycle number from when a read command is input to the pseudo SRAM 100 to when read data of the pseudo SRAM 100 are output to an external apparatus. Furthermore, the term "latency" also refers to information on a clock cycle number from when a write command is input to the pseudo SRAM 100 to when write data is written into the memory cells of the pseudo SRAM 100. For example, when a latency value of 3 is set in the mode register 103, the mode register 103 outputs a latency control signal (BCM3) as logic high and latency control signals (BCM1, BCM2, BCM4 to BCMi) as logic low.

The burst mode controller 104 receives the external address signals (EXADD1 to EXADDK) in response to the external clock signal (EXCLK), the chip select signal (CSB) and the address valid signal (ADVB). The burst mode controller 104 receives the external address signals (EXADD1 to EXADDK) in synchronization with the external clock signal (EXCLK) when the chip select signal (CSB) and the address valid signal (ADVB) are logic low. The address valid signal (ADVB) becomes logic low during a set time (i.e., while the external address signals (EXADD1 to EXADDK) are input) and is then changed to logic high. Therefore, the burst mode controller 104 receives new external address signals (EXADD1 to EXADDK) whenever the address valid signal (ADVB) becomes logic low.

Furthermore, the burst mode controller 104 continuously generates burst row address signals (CAX1 to CAXn) (n is an integer) and burst column address signals (CAY1 to CAYn) (n is an integer), which gradually rise from the external address signals (EXADD1 to EXADDK), based on the external address signals (EXADD1 to EXADDK). The burst mode controller 104 continuously generates the burst row address signals (CAX1 to CAXn) and the burst column address signals (CAY1 to CAYn) until the address valid signal (ADVB) shifts from a logic high to a logic low or the chip select signal (CSB) becomes logic high.

Furthermore, the burst mode controller 104 generates a first internal control signal (NORM), a burst operation control signal (WTRD_STB) and a word line control signal (ROWACT) in response to the external clock signal (EXCLK), the chip select signal (CSB), the address valid signal (ADVB), the write enable signal (WEB), the external address signals (EXADD1 to EXADDK), the precharge control signal (PCG) and the latency control signals (BCM1 to BCMi).

The read/write controller 105 generates a driver control signal (DRV_CON) in response to the word line control signal (ROWACT) and the precharge control signal (PCG). The read/write controller 105 enables the driver control signal (DRV_CON) when the word line control signal (ROWACT) is enabled to logic high, and disables the driver control signal (DRV_CON) when the precharge control signal (PCG) is enabled.

The memory cell array 106 includes a plurality of memory cells (not shown) having a DRAM cell structure.

The row decoder 107 decodes the burst row address signals (CAX1 to CAXn) and generates a burst row decoding signal (not shown).

The word line driver 108 continuously enables word lines WL1 to WLE) (E is an integer) of the memory cell array 106, one by one, in response to the burst row decoding signal when the driver control signal (DRV_CON) is enabled. Furthermore, when the driver control signal (DRV_CON) is disabled, the word line driver 107 disables the entire word lines of the memory cell array 106.

The column decoder 109 receives the burst column address signals (CAY1 to CAYn) when the burst operation control signal (WTRD_STB) is enabled to logic high. The column decoder 109 decodes received burst column address signals (CAY1 to CAYn) and generates a burst column decoding signal (not shown). As a result, output data of a bit line (one of BL1 to BLF) (F is an integer) corresponding to the burst column decoding signal are input from the memory cell array 106 to the sense amplifier circuit 110.

The sense amplifier circuit 110 senses and amplifies the output data received from a bit line (one of BL1 to BLF), which is selected by the column decoder 109, or outputs write data (DI) to a selected bit line (one of BL1 to BLF).

The data I/O circuit 111 outputs output data, which are received from the sense amplifier circuit 110, to an external apparatus as read data (DO). Furthermore, the data I/O circuit 111 outputs the write data (DI), which are received from the external apparatus, to the sense amplifier circuit 110.

Figure 2:
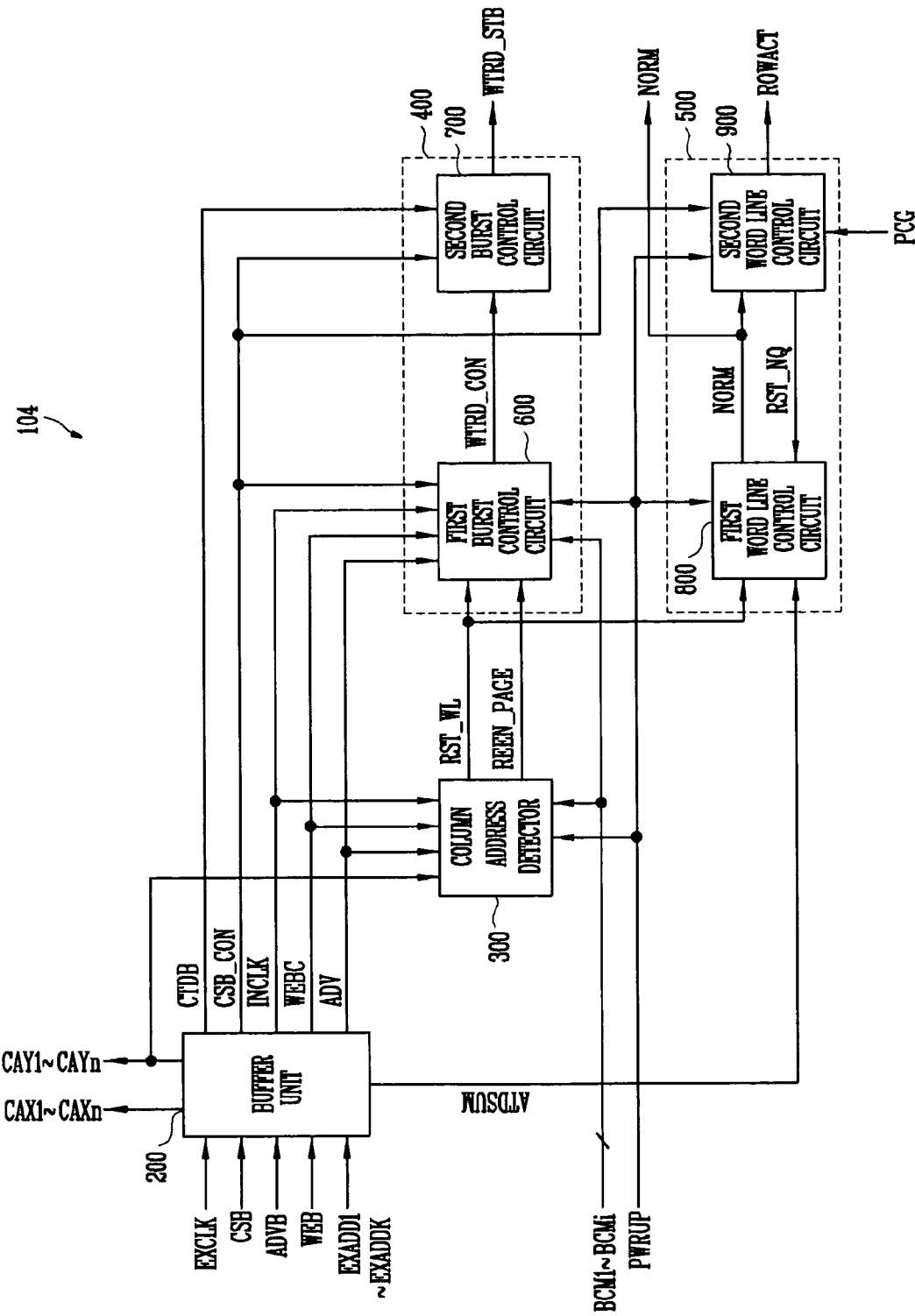
FIG. 2 is a detailed block diagram of a burst mode controller shown in FIG. 1.

FIG. 2 is a detailed block diagram of the burst mode controller 104 shown in FIG. 1.

Referring to FIG. 2, the burst mode controller 104 includes a buffer unit 200, a column address detector 300, a burst operation controller 400 and a word line controller 500.

The buffer unit 200 generates an internal address valid signal (ADV) in response to the external clock signal (EXCLK), the chip select signal (CSB) and the address valid signal (ADVB). Furthermore, the buffer unit 200 generates an internal clock signal (INCLK) and a control signal (CTDB) in response to the external clock signal (EXCLK), and generates a control signal (CSB_CON) in response to the chip select signal (CSB). The buffer unit 200 generates an internal write control signal (WEBC) in response to the external clock signal (EXCLK), the control signal (CSB_CON) and the write enable signal (WEB).

The write enable signal (WEB) becomes logic low in the write operation of the pseudo SRAM 100 and becomes logic high in the read operation of the pseudo SRAM 100. The buffer unit 200 outputs the internal write control signal (WEBC) as low level when both the control signal (CSB_CON) and the write enable signal (WEB) become logic low. Furthermore, the buffer unit 200 outputs the internal write control signal (WEBC) as high level when the write enable signal (WEB) becomes logic high.

Furthermore, the buffer unit 200 generates the burst row address signals (CAX1 to CAXn) and the burst column address signals (CAY1 to CAYn) in response to the external clock signal (EXCLK) and the external address signals (EXADD1 to EXADDK). Furthermore, the buffer unit 200 generates an address shift detection signal (ATDSUM) in response to the external clock signal (EXCLK), the chip select signal (CSB) and the external address signals (EXADD1 to EXADDK). The buffer unit 200 generates the address shift detection signal (ATDSUM) as low pulse signal form when the external address signals (EXADD1 to EXADDK) are received or the chip select signal (CSB) shifts to logic low.

The column address detector 300 generates a first detection signal (RST_WL) and a second detection signal (REEN_PAGE) in response to the internal clock signal (INCLK), the internal write control signal (WEBC), the internal address valid signal (ADV), the latency control signals (BCM2 to BCMi) and the burst column address signals (CAY1 to CAYn). In more detail, when the burst column address signals (CAY1 to CAYn) represent a last column address (e.g., the entire burst column address signals (CAY1 to CAYn) are logic '1'), the column address detector 300 generates the first detection signal (RST_WL) as a high pulse signal, and then generates the second detection signal (REEN_PAGE) as a high pulse signal after a set time elapses.

The burst operation controller 400 includes a first burst control circuit 600 and a second burst control circuit 700.

The first burst control circuit 600 generates a strobe control signal (WTRD_CON) in response to the power-up detection signal (PWRUP), the latency control signals (BCM1 to BCMi), the first and second detection signals (RST_WL, REEN_PAGE), the internal clock signal (INCLK), the control signal (CSB_CON), the internal write control signal (WEBC) and the internal address valid signal (ADV). In more detail, when the second detection signal (REEN_PAGE) is a high level, the first burst control circuit 600 enables the strobe control signal (WTRD_CON). Furthermore, the first burst control circuit 600 enables the strobe control signal (WTRD_CON) after a set time elapses when the internal address valid signal (ADV) is a high level. When the first detection signal (RST_WL) is a high level, the first burst control circuit 600 disables the strobe control signal (WTRD_CON).

The second burst control circuit 700 generates a burst operation control signal (WTRD_STB) in response to the strobe control signal (WTRD_CON). In more detail, the second burst control circuit 700 generates the burst operation control signal (WTRD_STB) as a high pulse signal periodically and repeatedly when the strobe control signal (WTRD_CON) is enabled.

The word line controller 500 includes a first word line control circuit 800 and a second word line control circuit 900.

The first word line control circuit 800 generates a first internal control signal (NORM) and a second internal control signal (RST_NQ) in response to the power-up detection signal (PWRUP), the first detection signal (RST_WL) and the address shift detection signal (ATDSUM). In more detail, the first word line control circuit 800 initially generates the first internal control signal (NORM) as logic high for a set time in response to the address shift detection signal (ATDSUM). Furthermore, the first word line control circuit 800 generates the first internal control signal (NORM) as logic high for a set time when the first detection signal (RST_WL) is a high level.

The second word line control circuit 900 generates a word line control signal (ROWACT) in response to the power-up detection signal (PWRUP), the first internal control signal (NORM), the control signal (CSB_CON) and the precharge control signal (PCG). In more detail, when both the first internal control signal (NORM) and the precharge control signal (PCG) are a high level, the second word line control circuit 900 outputs the word line control signal (ROWACT) as a high pulse signal.

Figure 3:
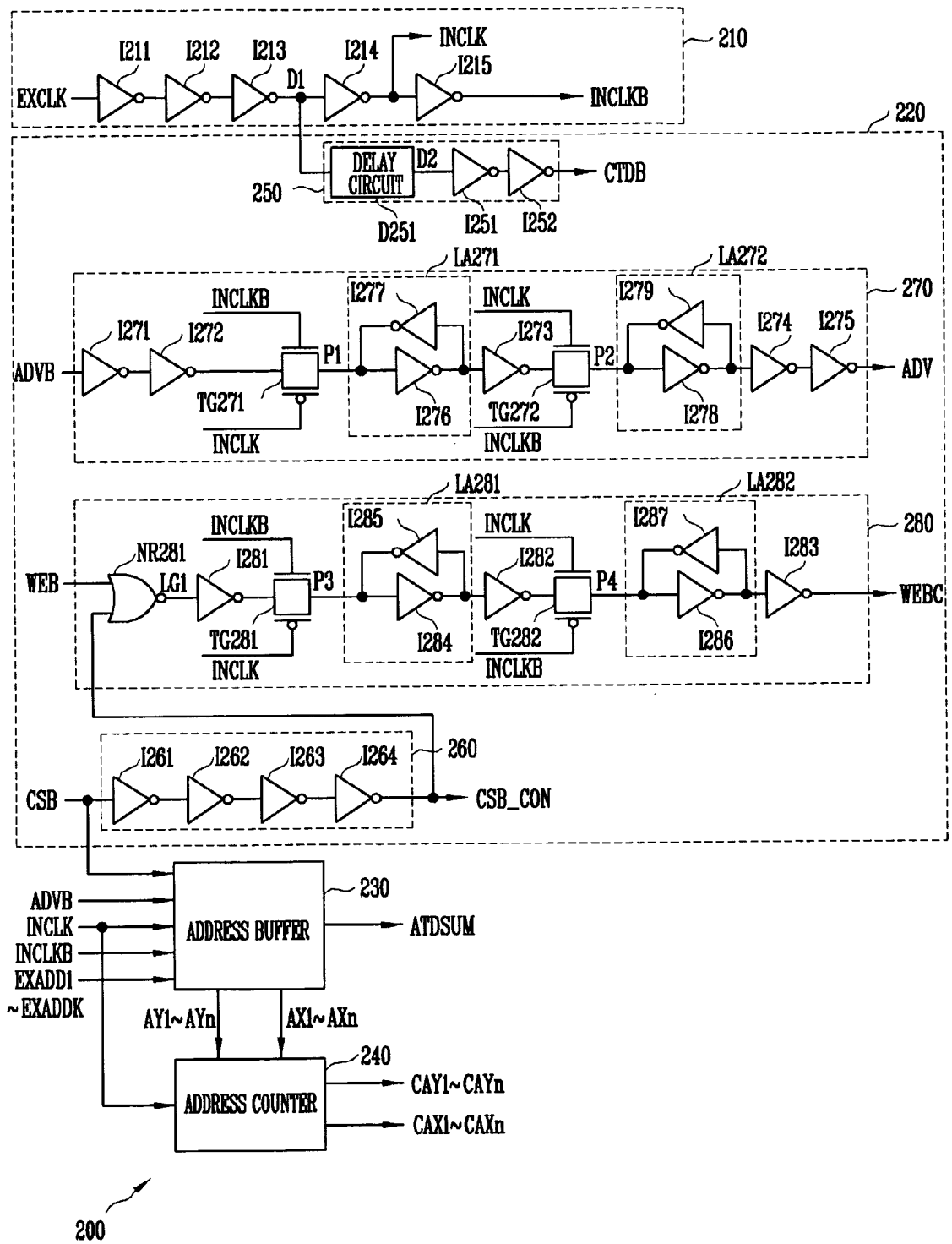
FIG. 3 is a detailed circuit diagram of a buffer unit shown in FIG. 2.

FIG. 3 is a detailed circuit diagram of the buffer unit 200 shown in FIG. 2.

Referring to FIG. 3, the buffer unit 200 includes an internal clock generating circuit 210, a control signal generating circuit 220, an address buffer 230 and an address counter 240.

The internal clock generating circuit 210 can include inverters I211 to I215 that are connected in series. The external clock signal (EXCLK) input to the inverter I211 is delayed by the inverters I211 to I213, and a delayed signal (D1) is output from the inverter I213. The inverter I214 inverts the delayed signal (D1) and outputs the inverted signal as an internal clock signal (INCLK). Furthermore, the inverter I215 inverts the internal clock signal (INCLK) and outputs an inverted internal clock signal (INCLKB).

The control signal generating circuit 220 includes first to fourth generating circuits 250 to 280. The first generating circuit 250 includes a delay circuit D251 and inverters I251, I252. The delay circuit D251 delays the delayed signal (D1)

for a first predetermined time and outputs a delayed signal (D2). To the output of the delay circuit D251 is connected inverters I251 and I252 in series. Inverters I251 and I252 further delay the delayed signal (D2) for a second predetermined time and output the delayed signal as a control signal (CTDB). The second generating circuit 260 includes inverters I261 to I264 that are connected in series. The chip select signal (CSB) input to the inverter I261 is delayed by the inverters I261 to I264 for a third predetermined time, and a control signal (CSB_CON) is output from the inverter I264.

The third generating circuit 270 includes inverters I271 to I275, pass gates TG271 and TG272 and latch circuits LA271 and LA272. The inverters I271 to I275 are connected in series. The pass gate TG271 and the latch circuit LA271 are connected between the inverters I272 and I273 in series. The pass gate TG272 and the latch circuit LA272 are connected between the inverters I273 and I274 in series. The address valid signal (ADVB) is input to the inverter I271 and is then delayed by the inverters I271 and I272.

The pass gate TG271 is turned on or off in response to the internal clock signal (INCLK) and the inverted internal clock signal (INCLKB). When the internal clock signal (INCLK) is logic low, the pass gate TG271 is turned on. When the pass gate TG271 is turned on, the pass gate TG271 receives an output signal of the inverter I272 and outputs the output signal to the latch circuit LA271 as a first pass signal (P1).

The latch circuit LA271 includes inverters I276 and I277, and latches the first pass signal (P1) and outputs the latched signal. The inverter I273 inverts the output signal of the latch circuit LA271.

The pass gate TG272 is turned on or off in response to the inverted internal clock signal (INCLKB) and the internal clock signal (INCLK). In more detail, when the internal clock signal (INCLK) is logic high, the pass gate TG272 is turned on. As a result, the pass gates TG271 and TG272 are alternately turned on in response to the internal clock signal (INCLK) and the inverted internal clock signal (INCLKB). When the pass gate TG272 is turned on, it receives the output signal of the inverter I273 and outputs the output signal to the latch circuit LA272 as a second pass signal (P2).

Furthermore, the latch circuit LA272 includes inverters I278 and I279. The latch circuit LA272 latches the second pass signal (P2) received from the pass gate TG272 and outputs the latched signal.

The inverters I274 and I275 delay the output signal of the latch circuit LA272 and output the delayed signal as the internal address valid signal (ADV). When the address valid signal (ADVB) is enabled to logic high, the internal address valid signal (ADV) is enabled to logic high. Furthermore, a time where the internal address valid signal (ADV) is high level is longer than a time where the address valid signal (ADVB) is low level.

The fourth generating circuit 280 includes a NOR gate NR281, inverters I281 to I283, pass gates TG281 and TG282 and latch circuits LA281 and LA282.

The NOR gate NR281 outputs a logic signal (LG1) in response to the control signal (CSB_CON) and the write enable signal (WEB). When both the control signal (CSB_CON) and the write enable signal (WEB) are all logic low, the NOR gate NR281 outputs the logic signal (LG1) as logic high.

The inverters I281 to I283 are connected to the output terminal of the NOR gate NR281 in series. Furthermore, the pass gate TG281 and the latch circuit LA281 are connected in series between the inverters I281 and I282. The pass gate TG282 and the latch circuit LA282 are connected in series between the inverters I282 and I283. The inverter I281 inverts the logic signal (LG1).

The pass gates TG281 and TG282 are turned on or off in response to the internal clock signal (INCLK) and the inverted internal clock signal (INCLKB). In more detail, when the internal clock signal (INCLK) is logic low, the pass gate TG281 is tuned on. When the internal clock signal (INCLK) is logic high, the pass gate TG282 is turned on. As a result, the pass gates TG281 and TG282 are alternately turned on in response to the internal clock signal (INCLK) and the inverted internal clock signal (INCLKB).

When the pass gate TG281 is turned on, it receives the output signal of the inverter I281 and outputs it as a third pass signal (P3). The latch circuit LA281 latches the third pass signal (P3) and outputs the latched signal. The inverter I282 inverts the output signal of the latch circuit LA281. When the pass gate TG282 is turned on, the pass gate TG282 receives the output signal of the inverter I282 and outputs the output signal as a fourth pass signal (P4). The latch circuit LA282 latches the fourth pass signal (P4) and outputs the latched signal. The inverter I283 inverts the output signal of the latch circuit LA282 and outputs the inverted signal as the internal write control signal (WEBC).

The address buffer 230 receives the external address signals (EXADD1 to EXADDK) in synchronization with the internal clock signal (INCLK) and the inverted internal clock signal (INCLKB) when the address valid signal (ADVB) is low level. The address buffer 230 outputs the internal row address signals (AX1 to AXn) and the internal column address signals (AY1 to AYn) based on the external address signals (EXADD1 to EXADDK).

Furthermore, the address buffer 230 outputs the address shift detection signal (ATDSUM) in response to the chip select signal (CSB) and the address valid signal (ADVB). In more detail, when the chip select signal (CSB) or the address valid signal (ADVB) shifts to a low level, the address buffer 230 generates the address shift detection signal (ATDSUM) as a low pulse signal.

The address counter 240 generates the burst row address signals (CAX1 to CAXn) and the burst column address signals (CAY1 to CAYn) in response to the internal clock signal (INCLK), the internal row address signals (AX1 to AXn) and the internal column address signals (AY1 to AYn). In more detail, the address counter 240 generates the burst row address signals (CAX1 to CAXn), which gradually rise from the internal row address signals (AX1 to AXn), and generates the burst column address signals (CAY1 to CAYn), which gradually rise from the internal column address signals (AY1 to AYn).

Figure 4:
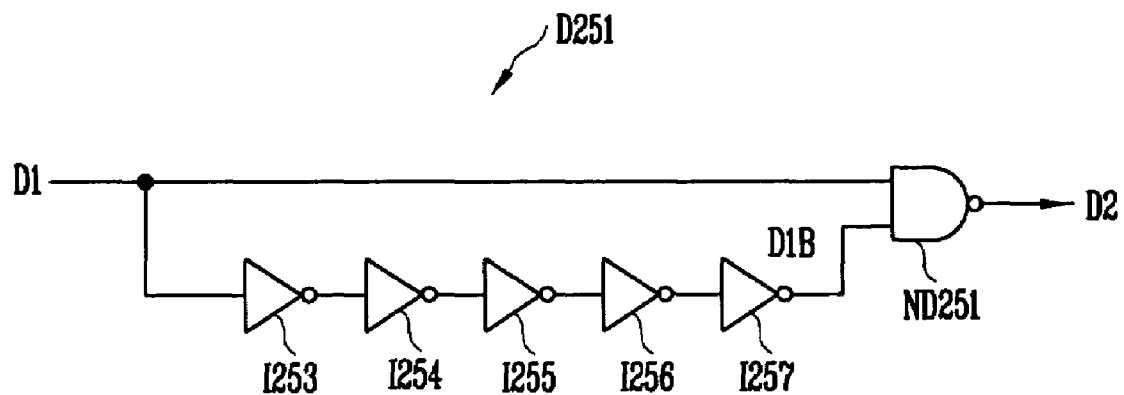
FIG. 4 is a detailed circuit diagram of a delay circuit shown in FIG. 3.

FIG. 4 is a detailed circuit diagram of the delay circuit D251 shown in FIG. 3.

Referring to FIG. 4, the delay circuit D251 includes inverters I253 to I257 and an NAND gate ND251. The inverters I253 to I257 are connected in series. The delayed signal (D1) is input to the inverter I253. The delayed signal (D1) is delayed by the inverters I253 to I257 for a set time (T, see FIG. 5). A delayed signal (D1B) is output from the inverter I257.

Figure 5:
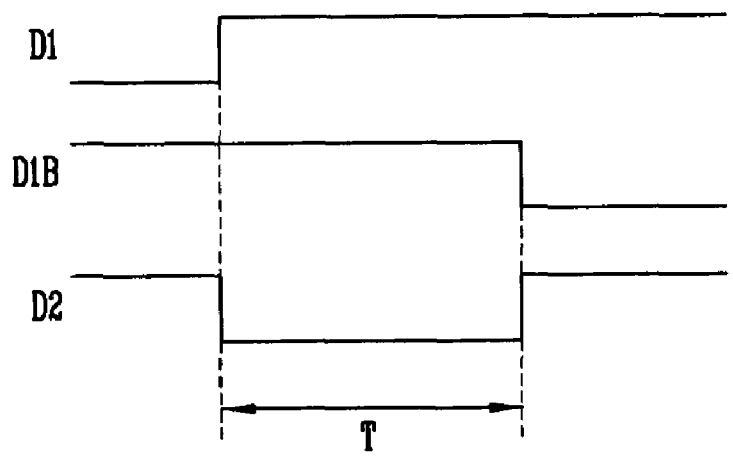
FIG. 5 is a timing diagram showing signals related to the operation of the delay circuit shown in FIG. 4.

The NAND gate ND251 outputs the delayed signal (D2) in response to the delayed signals (D1, D1B). In more detail, when both the delay circuits D1, D1B are logic high, the NAND gate ND251 outputs the delayed signal (D2) as logic low. Therefore, the delayed signal (D2) becomes logic low for the time (T), as shown in FIG. 5.

Figure 6:
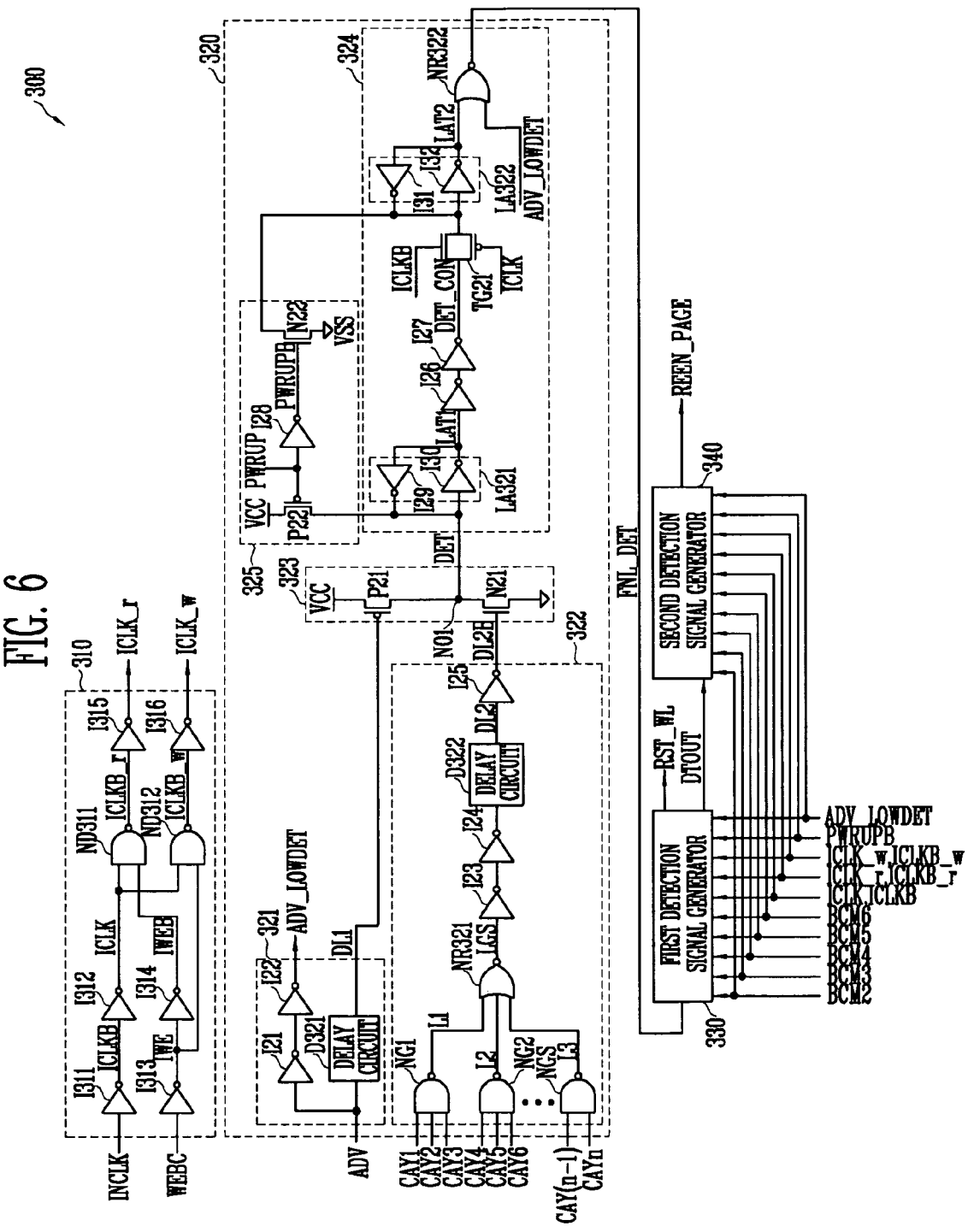
FIG. 6 is a detailed circuit diagram of a column address detector shown in FIG. 2.
Figure 7:
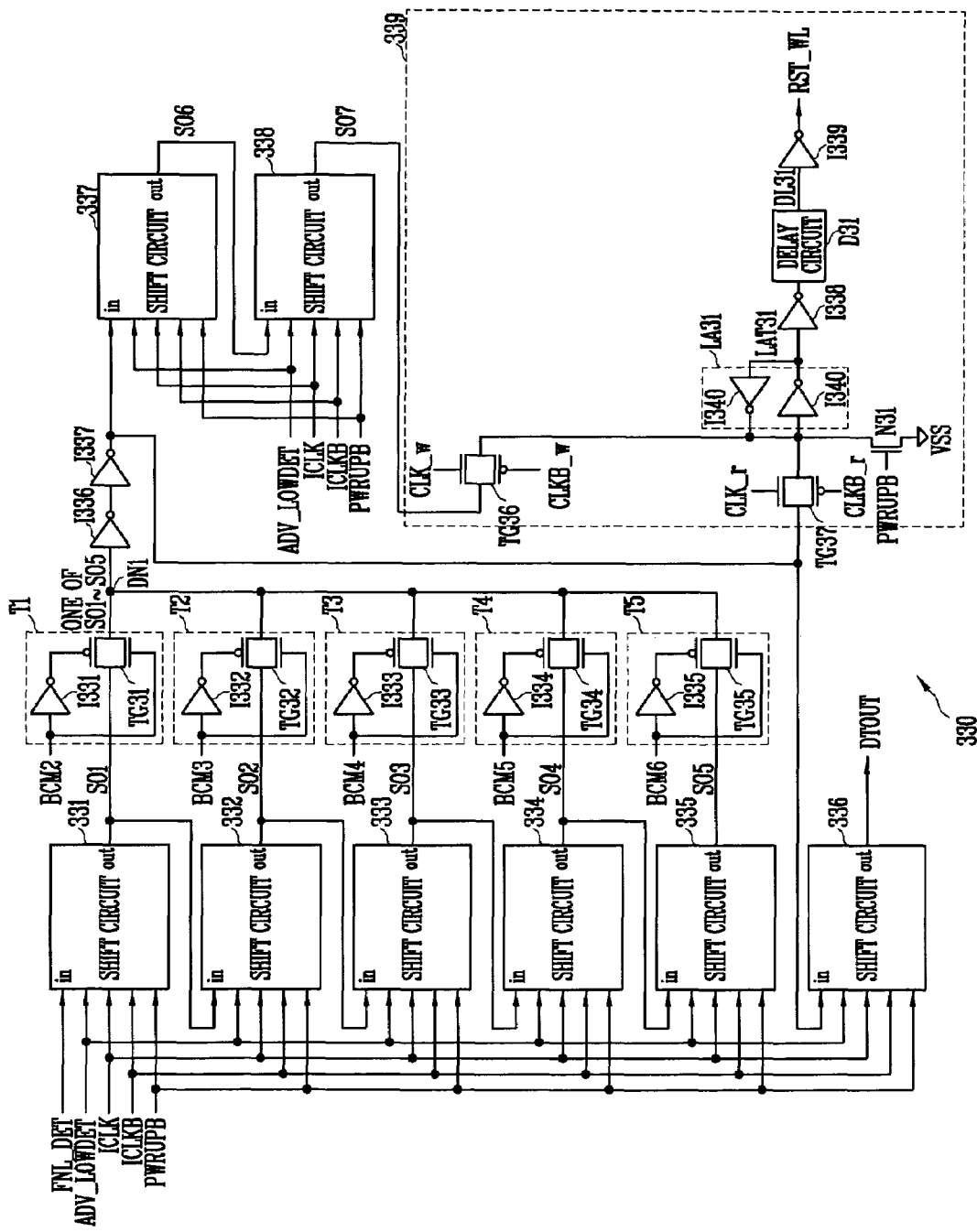
FIG. 7 is a detailed circuit diagram of a first detection signal generator shown in FIG. 6.
Figure 8:
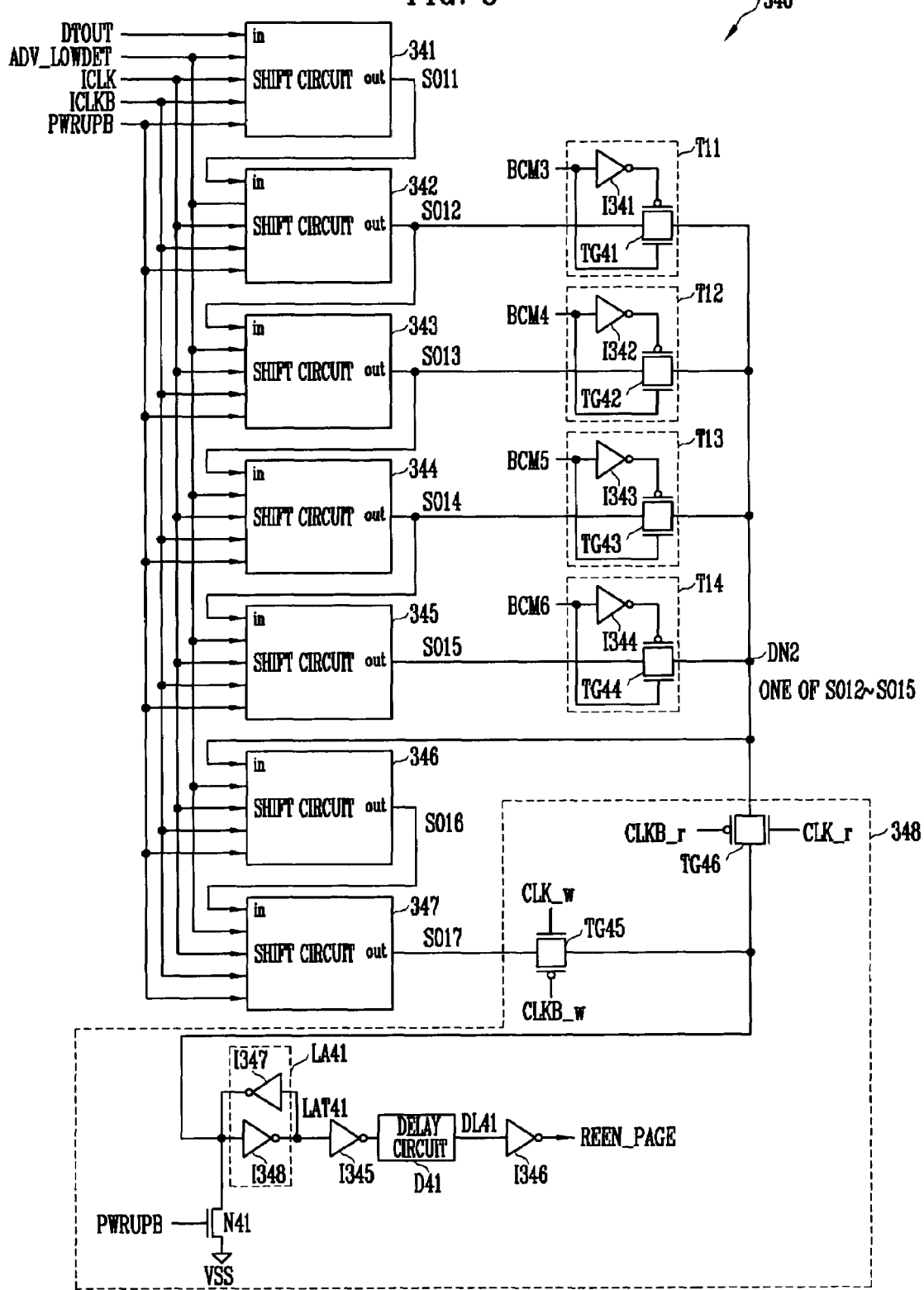
FIG. 8 is a detailed circuit diagram of a second detection signal generator shown in FIG. 6.

FIG. 6 is a detailed circuit diagram of the column address detector 300 shown in FIG. 2. FIGS. 6 to 8 show an example of the column address detector 300 to which the latency control signals (BCM2 to BCM6) are applied.

Referring to FIG. 6, the column address detector 300 includes a control clock generating circuit 310, a last column detection circuit 320, a first detection signal generator 330 and a second detection signal generator 340.

The control clock generating circuit 310 includes inverters I311 to I316 and NAND gates ND311 and ND312.

The inverter I311 inverts the internal clock signal (INCLK) and outputs the inverted signal as an inverted control clock signal (ICLKB).

The inverter I312 inverts the inverted control clock signal (ICLKB) and outputs a control clock signal (ICLK). As a result, the internal clock signal (INCLK) is delayed while passing through the inverters I311 and I312, and is then output as the control clock signal (ICLK). The control clock signal (ICLK) has the same phase as that of the external clock signal (EXCLK).

The inverter I313 inverts the internal write control signal (WEBC) and outputs the inverted signal as an internal signal (IWE).

The inverter I314 inverts the internal signal (IWE) and outputs an inverted internal signal (IWEB). The internal write control signal (WEBC) becomes logic low in the write operation of the pseudo SRAM 100 and becomes logic high in the read operation of the pseudo SRAM 100.

The NAND gate ND311 outputs an inverted read clock signal (ICLKB_r) in response to the control clock signal (ICLK) and the inverted internal signal (IWEB).

The inverter I315 inverts the inverted read clock signal (ICLKB_r) and outputs a read clock signal (ICLK_r). In more detail, when the inverted internal signal (IWEB) is logic low (i.e., when the internal write control signal (WEBC) is logic low), the NAND gate ND311 continuously outputs the inverted read clock signal (ICLKB_r) as logic high regardless of a logic level of the control clock signal (ICLK). Furthermore, when the inverted internal signal (IWEB) is logic high (i.e., when the internal write control signal (WEBC) is logic high), the NAND gate ND311 outputs the inverted read clock signal (ICLKB_r) in synchronization with the control clock signal (ICLK).

The NAND gate ND312 outputs an inverted write clock signal (ICLKB_w) in response to the control clock signal (ICLK) and the internal signal (IWE). The inverter I316 inverts the inverted write clock signal (ICLKB_w) and outputs a write clock signal (ICLK_w).

In more detail, when the internal signal (IWE) is logic high (i.e., when the internal write control signal (WEBC) is logic low), the NAND gate ND312 outputs the inverted write clock signal (ICLKB_w) in synchronization with the control clock signal (ICLK). Furthermore, when the internal signal (IWE) is logic low (i.e., when the internal write control signal (WEBC) is logic high), the NAND gate ND312 continuously outputs the inverted write clock signal (ICLKB_w) as logic high regardless of a logic value of the control clock signal (ICLK).

As a result, when the internal write control signal (WEBC) is logic low (i.e., in the write operation of the pseudo SRAM 100), the control clock generating circuit 310 outputs the write clock signal (ICLK_w) and the inverted write clock signal (ICLKB_w). Furthermore, when the internal write control signal (WEBC) of a logic high (i.e., in the read operation of the pseudo SRAM 100), the control clock generating circuit 310 outputs the read clock signal (ICLK_r) and the inverted read clock signal (ICLKB_r).

The last column detection circuit 320 includes a first detection circuit 321, a second detection circuit 322, a driver 323, an output circuit 324 and a latch reset circuit 325.

The first detection circuit 321 includes inverters I21 and I22 and a delay circuit D321. The inverters I21 and I22 delay the internal address valid signal (ADV) and output a valid shift detection signal (ADV_LOWDET). The delay circuit D321 delays the internal address valid signal (ADV) and outputs a delayed signal (DL1). The construction and operation of the delay circuit D321 are substantially the same as those of the aforementioned delay circuit D251, which have been described with reference to FIGS. 4 and 5. Description thereof is omitted.

The second detection circuit 322 includes NAND gates NG1 to NGS (S is an integer), an NOR gate NR321, inverters I23 to I25 and a delay circuit D322.

The NAND gate NG1 outputs a logic signal (L1) in response to the burst column address signals (CAY1 to CAY3). When the burst column address signals (CAY1 to CAY3) are logic high, the NAND gate NG1 outputs the logic signal (L1) as logic low. The NAND gate NG2 outputs a logic signal (L2) in response to the burst column address signals (CAY4 to CAY6).

Furthermore, the NAND gate NGS outputs a logic signal (LS) (S is an integer) in response to the burst column address signals (CAY(n−1) and CAYn). Furthermore, the NAND gates NG3 to NG(S−1) (not shown) output logic signals (L3 to L(S−1)) in response to the burst column address signals (CAY7 to CAY(n−2)).

The NOR gate NR321 outputs a logic signal (LGS) as logic high when the logic signals (L1 to LS) become logic low. The inverters I23 and I24 delay the logic signal (LGS). The delay circuit D322 delays the output signal of the inverter I24 and outputs a delayed signal (DL2). The construction and operation of the delay circuit D322 are substantially the same as those of the aforementioned delay circuit D251, which have been described with reference to FIGS. 4 and 5. Description thereof is omitted.

The inverter I25 inverts the delayed signal (DL2) and output an inverted signal (DL2B). As a result, when the burst column address signals (CAY1 to CAYn) are all high level, the inverted signal (DL2B) becomes logic high during a set time.

The driver 323 includes a PMOS transistor P21 and an NMOS transistor N21. The driver 323 outputs a first internal detection signal (DET) to an output node NO1 in response to the delayed signal (DL1) and the inverted signal (DL2B). In more detail, when the delayed signal (DL1) is low level, the PMOS transistor P21 is turned on in response to the delayed signal (DL1).

Furthermore, when the inverted signal (DL2B) is logic high, the NMOS transistor N21 is turned on in response to the inverted signal (DL2B). When the PMOS transistor P21 is turned on and the NMOS transistor N21 is turned off, the driver 323 outputs the first internal detection signal (DET) to the output node NO1 as logic high. To the contrary, when the PMOS transistor P21 is turned off and the NMOS transistor N21 is turned on, the driver 323 outputs the first internal detection signal (DET) to the output node NO1 as logic low.

The output circuit 324 includes latch circuits LA321 and LA322, inverters I26 and I27, a pass gate TG21 and NOR gate NR322.

The latch circuit LA321 latches the first internal detection signal (DET) and outputs the latched signal (LAT1). The inverters I26 and I27 delay the latched signal (LAT1) and output the delayed signal as a second internal detection signal (DET_CON). The pass gate TG21 is turned on or off in response to the control clock signal (ICLK) and the inverted control clock signal (ICLKB). When the control clock signal (ICLK) is logic low, the pass gate TG21 is turned on to receive the second internal detection signal (DET_CON) and outputs it to the latch circuit LA322.

The latch circuit LA322 latches the second internal detection signal (DET_CON) and outputs the latched signal (LAT2). The NOR gate NR322 outputs a third internal detection signal (FNL_DET) in response to the latched signal (LAT2) and the valid shift detection signal (ADV_LOWDET). When both the latched signal (LAT2) and the valid shift detection signal (ADV_LOWDET) are logic low, the NOR gate NR322 outputs the third internal detection signal (FNL_DET) as logic high.

As a result, when the burst column address signals (CAY1 to CAYn) are all high level and the valid shift detection signal (ADV_LOWDET) is a low level (i.e., when the internal address valid signal (ADV) is a low level), the last column detection circuit 320 outputs the third internal detection signal (FNL_DET) as logic high.

The latch reset circuit 325 includes a PMOS transistor P22, an NMOS transistor N22 and an inverter I28. The PMOS transistor P22 is turned on or off in response to the power-up detection signal (PWRUP) and outputs an internal voltage (VCC) to the latch circuit LA321. As a result, the latch circuit LA321 is reset to output the latched signal (LAT1) as logic low.

The inverter I28 inverts the power-up detection signal (PWRUP) and outputs an inverted power-up detection signal (PWRUPB). The NMOS transistor N22 is turned on or off in response to the inverted power-up detection signal (PWRUPB) and outputs a ground voltage (VSS) to the latch circuit LA322. As a result, the latch circuit LA322 is reset to output the latched signal (LAT2) as logic high.

The first detection signal generator 330 generates a first detection signal (RST_WL) and an output signal (DTOUT) in response to the third internal detection signal (FNL_DET), the latency control signals (BCM2 to BCM6), the control clock signals (ICLK and ICLKB), the read clock signals (ICLK_r and ICLKB_r), the write clock signals (ICLK_w and ICLKB_w), the inverted power-up detection signal (PWRUPB) and the valid shift detection signal (ADV_LOWDET).

The second detection signal generator 340 generates a second detection signal (REEN_PAGE) in response to the output signal (DTOUT), the latency control signals (BCM2 to BCM6), the control clock signals (ICLK and ICLKB), the read clock signals (ICLK_r and ICLKB_r), the write clock signals (ICLK_w and ICLKB_w), the inverted power-up detection signal (PWRUPB) and the valid shift detection signal (ADV_LOWDET).

FIG. 7 is a detailed circuit diagram of the first detection signal generator 330 shown in FIG. 6.

Referring to FIG. 7, the first detection signal generator 330 includes shift circuits 331 to 338, pass circuits T1 to T5, inverters I336 and I337 and a detection signal output unit 339.

The shift circuits 331 to 335 are connected in series. For example, an output terminal (out) of the shift circuit 331 can be connected to an input terminal (in) of the shift circuit 332. An output terminal (out) of the shift circuit 332 can be connected an input terminal (in) of the shift circuit 333 and so on. The valid shift detection signal (ADV_LOWDET), the control clock signal (ICLK) and the inverted control clock signal (ICLKB) are input to the shift circuits 331 to 338 at the same time. Furthermore, the shift circuits 331 to 338 are reset in response to the inverted power-up signal (PWRUPB).

The third internal detection signal (FNL_DET) is input to an input terminal (in) of the shift circuit 331. The shift circuit 331 outputs a shift signal (SO1) in response to the third internal detection signal (FNL_DET), the valid shift detection signal (ADV_LOWDET), the control clock signal (ICLK) and the inverted control clock signal (ICLKB). The shift signal (SO1) is input to the input terminal (in) of the shift circuit 332.

The shift circuit 332 outputs a shift signal (SO2) in response to the shift signal (SO1), the valid shift detection signal (ADV_LOWDET), the control clock signal (ICLK) and the inverted control clock signal (ICLKB). The shift circuits 333 to 335 operate similar to the shift circuit 332 and output shift signals (SO3 to SO5), respectively The pass circuits T1 to T5 are connected to the shift circuits 331 to 335, respectively, and are enabled or disabled in response to the latency control signals (BCM2 to BCM6), respectively. Each of the pass circuits T1 to T5 includes an inverter (one of I331 to I335) and a pass gate (one of TG31 to TG35).

For example, the pass circuit T1 can include the inverter I331 and the pass gate TG31. The inverters I331 to I335 invert the latency control signals (BCM2 to BCM6), respectively. The pass gates TG31 to TG35 are turned on or off in response to the latency control signals (BCM2 to BCM6) and the output signals of the inverters I331 to I335, respectively.

When the pass circuits T1 to T5 are enabled, they output the shift signals (SO1 to SO5) to a node DN1. In more detail, when one of the latency control signals (BCM2 to BCM6) is enabled, the remaining signals are disabled. Therefore, the pass circuit (one of T1 to T5) is enabled and outputs the shift signal (one of SO1 to SO5), which is received from a corresponding shift circuit (one of 331 to 335), to the node DN1.

The inverters I336 and I337 delay the shift signal (one of SO1 to SO5), which is received from one of the pass circuits T1 to T5 through the node DN1.

The shift circuit 336 outputs an output signal (DTOUT) in response to the shift signal (one of SO1 to SO5) received from the inverter I337, the valid shift detection signal (ADV_LOWDET), the control clock signal (ICLK) and the inverted control clock signal (ICLKB).

The shift circuit 337 outputs a shift signal (SO6) in response to the shift signal (one of SO1 to SO5) received from the inverter I337, the valid shift detection signal (ADV_LOWDET), the control clock signal (ICLK) and the inverted control clock signal (ICLKB).

The shift circuit 338 outputs a shift signal (SO7) in response to the shift signal (SO6), the valid shift detection signal (ADV_LOWDET), the control clock signal (ICLK) and the inverted control clock signal (ICLKB).

The detection signal output unit 339 includes pass gates TG36 and TG37, a latch circuit LA31, inverters I338 and I339, a delay circuit D31 and a latch reset circuit N31.

The pass gate TG36 is turned on or off in response to the write clock signal (ICLK_w) and the inverted write clock signal (ICLKB_w). In more detail, when the write clock signal (ICLK_w) is logic high, the pass gate TG36 is turned on to receive the shift signal (SO7) and then output it to the latch circuit LA31.

The pass gate TG37 is turned on or off in response to the read clock signal (ICLK_r) and the inverted read clock signal (ICLKB_r). In more detail, when the read clock signal (ICLK_r) is logic high, the pass gate TG37 is turned on to output the shift signal (one of SO1 to SO5), which is received from the inverter I337, to the latch circuit LA31. When one of the read clock signal (ICLK_r) and the write clock signal (ICLK_w) is logic high, the other of the read clock signal (ICLK_r) and the write clock signal (ICLK_w) is logic low. Therefore, one of the pass gates TG36 or TG37 is turned on.

The latch circuit LA31 includes an inverter I340. The latch circuit LA31 latches the shift signal (SO7) received from the pass gate TG36 or the shift signal (one of SO1 to SO5) received from the pass gate TG37, and then outputs the latched signal (LAT31).

The inverter I338 inverts the latched signal (LAT31). The delay circuit D31 delays the output signal of the inverter I338 and outputs the delayed signal (DL31). The construction and operation of the delay circuit D31 are substantially the same as those of the aforementioned delay circuit D251, which have been described with reference to FIGS. 4 and 5. Description thereof is omitted.

The inverter I339 inverts the delayed signal (DL31) and outputs the inverted signal as the first detection signal (RST_WL).

The latch reset circuit N31 resets the latch circuit LA31 in response to the inverted power-up detection signal (PWRUPB). The latch reset circuit N31 can be implemented using an NMOS transistor. When the inverted power-up detection signal (PWRUPB) is logic high, the ground voltage (VSS) is output to the latch circuit LA31. As a result, the latch circuit LA31 is reset to output the latched signal (LAT31) as logic high.

As a result, in the read operation of the pseudo SRAM 100, the first detection signal generator 330 delays the third internal detection signal (FNL_DET) using some or all of the shift circuits 331 to 335, and outputs the delayed signal as the first detection signal (RST_WL) in synchronization with the read clock signal (ICLK_r).

Furthermore, in the write operation of the pseudo SRAM 100, the first detection signal generator 330 delays the third internal detection signal (FNL_DET) as much as a time where it is delayed by the shift circuits 337 and 338, rather than a time in which the third internal detection signal (FNL_DET) is delayed in the read operation of the pseudo SRAM 100, and outputs the delayed signal as the first detection signal (RST_WL) in synchronization with the write clock signal (ICLK_w).

As described above, the time where the first detection signal generator 330 outputs the first detection signal (RST_WL) in the read operation of the pseudo SRAM 100 and the time where the first detection signal generator 330 outputs the first detection signal (RST_WL) in the write operation of the pseudo SRAM 100 are set to be different from each other.

FIG. 8 is a detailed circuit diagram of the second detection signal generator 340 shown in FIG. 6.

Referring to FIG. 8, the second detection signal generator 340 includes shift circuits 341 to 347, pass circuits T11 to T14 and a detection signal output unit 348.

The shift circuits 341 to 345 are connected in series. For example, an input terminal (in) of the shift circuit 342 can be connected to an output terminal (out) of the shift circuit 341. An input terminal (in) of the shift circuit 343 can be connected to an output terminal (out) of the shift circuit 342 and so on. The valid shift detection signal (ADV_LOWDET), the control clock signal (ICLK) and the inverted control clock signal (ICLKB) are input to the shift circuits 341 to 347 at the same time. Furthermore, the shift circuits 341 to 347 are reset in response to the inverted power-up signal (PWRUPB).

To the input terminal (in) of the shift circuit 341 are input the output signal (DTOUT) output from the shift circuit 336 of the first detection signal generator 330. The shift circuit 341 outputs a shift signal (SO11) in response to the output signal (DTOUT), the valid shift detection signal (ADV_LOWDET), the control clock signal (ICLK) and the inverted control clock signal (ICLKB). The shift signal (SO11) is input to the input terminal (in) of the shift circuit 342.

The shift circuit 342 outputs a shift signal (SO12) in response to the shift signal (SO11), the valid shift detection signal (ADV_LOWDET), the control clock signal (ICLK) and the inverted control clock signal (ICLKB).

The shift circuits 343 to 345 operate in the same manner as the shift circuit 342 and output shift signals (SO13 to SO15), respectively.

The pass circuits T11 to T14 are connected to the shift circuits 342 to 345, respectively, and are enabled or disabled in response to the latency control signals (BCM3 to BCM6), respectively. Each of the pass circuits T11 to T14 includes an inverter (one of I341 to I344) and a pass gate (one of TG41 to TG44). For example, the pass circuit T11 can include the inverter I341 and the pass gate TG41. The inverters I341 to I344 invert the latency control signals (BCM3 to BCM6), respectively. The pass gates TG41 to TG44 are turned on or off in response to the latency control signals (BCM3 to BCM6) and the output signals of the inverters I341 to I344, respectively.

The pass circuits T11 to T14 are enabled to output the shift signals (SO12 to SO15), respectively, to the node DN2. In more detail, when one of the latency control signals (BCM3 to BCM6) is enabled, the remaining signals are disabled. Therefore, one of the pass circuits T11 to T14 is enabled to output the shift signal (one of SO12 to SO15), which is received from a corresponding shift circuit (one of 342 to 345), to the node DN2.

The input terminal (in) of the shift circuit 346 is connected to the node DN2. The shift circuit 346 outputs a shift signal (SO16) in response to the shift signal (one of SO12 to SO15) received from the node DN2, the valid shift detection signal (ADV_LOWDET), the control clock signal (ICLK) and the inverted control clock signal (ICLKB). The shift circuit 347 outputs a shift signal (SO17) in response to the shift signal (SO16), the valid shift detection signal (ADV_LOWDET), the control clock signal (ICLK) and the inverted control clock signal (ICLKB).

The detection signal output unit 348 includes pass gates TG45, TG46, a latch circuit LA41, inverters I345 and I346, a delay circuit D41 and a latch reset circuit N41.

The pass gate TG45 are turned on or off in response to the write clock signal (ICLK_w) and the inverted write clock signal (ICLKB_w). In more detail, when the write clock signal (ICLK_w) is logic high, the pass gate TG45 is turned on to receive the shift signal (SO17) and then output it to the latch circuit LA41.

The pass gate TG46 is turned on or off in response to the read clock signal (ICLK_r) and the inverted read clock signal (ICLKB_r). In more detail, when the read clock signal (ICLK_r) is logic high, the pass gate TG46 is turned on to output the shift signal (one of SO12 to SO15), which is received from the node DN2, to the latch circuit LA41. When any one of the read clock signal (ICLK_r) and the write clock signal (ICLK_w) is logic high, the other one is logic low. Therefore, one of the pass gates TG36 and TG37 is turned on.

The latch circuit LA41 includes inverters I347 and I348. The latch circuit LA41 latches the shift signal (SO17) received from the pass gate TG45, or the shift signal (one of SO12 to SO15) received from the pass gate TG46, and outputs the latched signal (LAT41).

The inverter I345 inverts the latched signal (LAT41) and outputs the inverted signal. The delay circuit D41 delays the output signal of the inverter I345 and outputs a delayed signal (DL41). The construction and operation of the delay circuit D41 are substantially the same as those of the aforementioned delay circuit D251, which has been described with reference to FIGS. 4 and 5. Description thereof is omitted.

The inverter I346 inverts the delayed signal (DL41) and outputs the inverted signal as a second detection signal (REEN_PAGE). As described above, in the same manner as the first detection signal generator 330, a time where the second detection signal generator 340 outputs the second detection signal (REEN_PAGE) in the read operation of the pseudo SRAM 100 and a time where the second detection signal generator 340 outputs the second detection signal (REEN_PAGE) in the write operation of the pseudo SRAM 100 are set to be different from each other.

The latch reset circuit N41 resets the latch circuit LA41 in response to the inverted power-up detection signal (PWRUPB). The latch reset circuit N41 can be implemented using an NMOS transistor. When the inverted power-up detection signal (PWRUPB) is logic high, the latch reset circuit N41 outputs the ground voltage (VSS) to the latch circuit LA41. As a result, the latch circuit LA41 is reset to output the latched signal (LAT41) as logic high.

Figure 9:
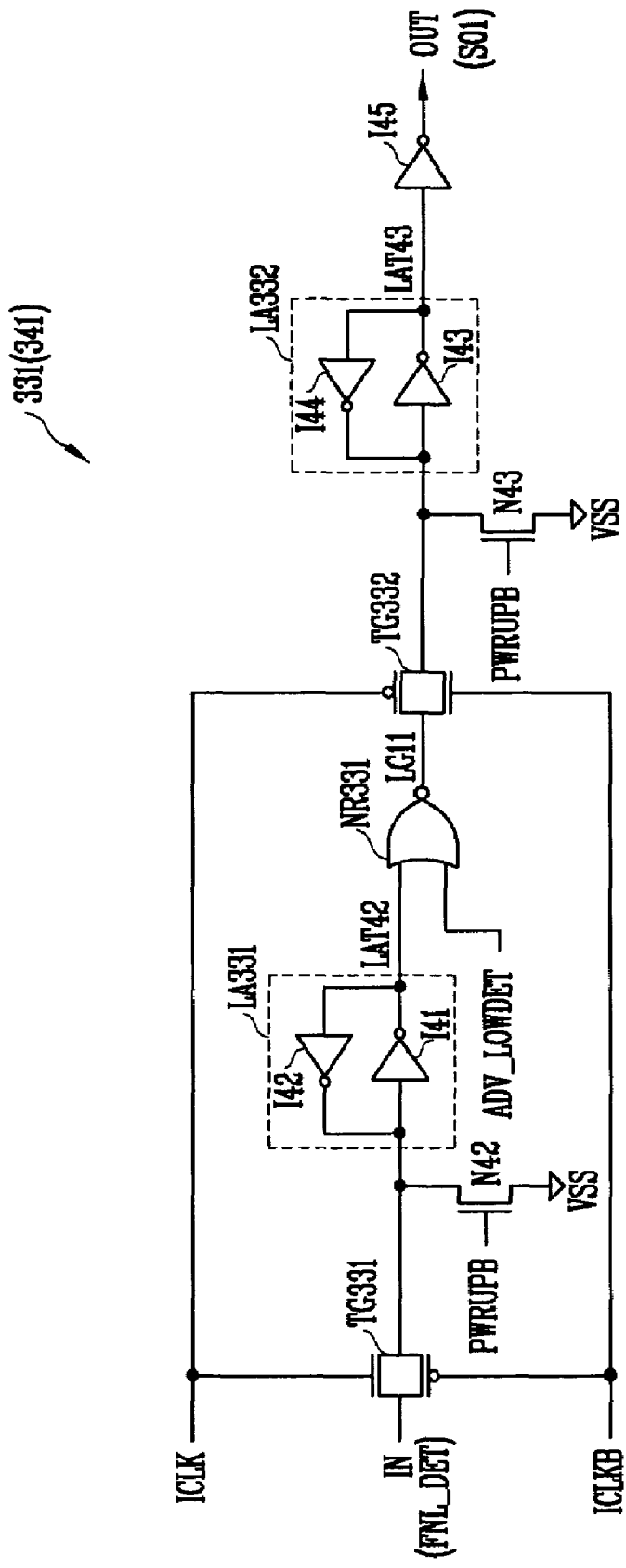
FIG. 9 is a detailed circuit diagram of a shift circuit shown in FIGS. 7 and 8.

FIG. 9 is a detailed circuit diagram of the shift circuits shown in FIGS. 7 and 8.

The construction and operation of the shift circuits 332 to 338, 341 to 347 are substantially the same as those of the shift circuit 331. Therefore, only the shift circuit 331 will be described as an example.

Referring to FIG. 9, the shift circuit 331 includes pass gates TG331 and TG332, latch circuits LA331 and LA332, an NOR gate NR331, an inverter I45 and latch reset circuits N42 and N43.

The pass gate TG331 is turned on or off in response to the control clock signal (ICLK) and the inverted control clock signal (ICLKB). When the control clock signal (ICLK) is logic high, the pass gate TG331 is turned on to receive an input signal (IN) and then to output it to the latch circuit LA331. The input signal (IN) is the third internal detection signal (FNL_DET) output from the last column detection circuit 320.

The latch circuit LA331 includes inverters I41 and I42. The latch circuit LA331 latches the input signal (IN) and outputs the latched signal (LAT42).

The NOR gate NR331 outputs a logic signal (LG11) in response to the latched signal (LAT42) and the valid shift detection signal (ADV_LOWDET). When both the latched signal (LAT42) and the valid shift detection signal (ADV_LOWDET) are logic low, the NOT gate NR331 outputs the logic signal (LG11) as logic high.

The pass gate TG332 is turned on or off in response to the control clock signal (ICLK) and the inverted control clock signal (ICLKB). When the control clock signal (ICLK) is logic low, the pass gate TG332 is turned on to receive the logic signal (LG11) and then to output the signal to the latch circuit LA332. As a result, when the pass gate TG331 is turned on, the pass gate TG332 is turned off. When the pass gate TG331 is turned off, the pass gate TG332 is turned on. The latch circuit LA332 includes inverters I43 and I44. The latch circuit LA332 latches the logic signal (LG11) and outputs the latched signal (LAT43).

The inverter I45 inverts the latched signal (LAT43) and outputs the inverted signal as an output signal (OUT) (i.e., as the shift signal (SO1)).

Each of the latch reset circuits N42 and N43 can be implemented using an NMOS transistor. The latch reset circuits N42 and N43 output the ground voltage (VSS) to the latch circuits LA331 and LA332 when the inverted power-up detection signal (PWRUPB) is logic high. As a result, the latch circuits LA331 and LA332 are reset to output the latched signals (LAT42 and LAT43) as logic high.

Figure 10:
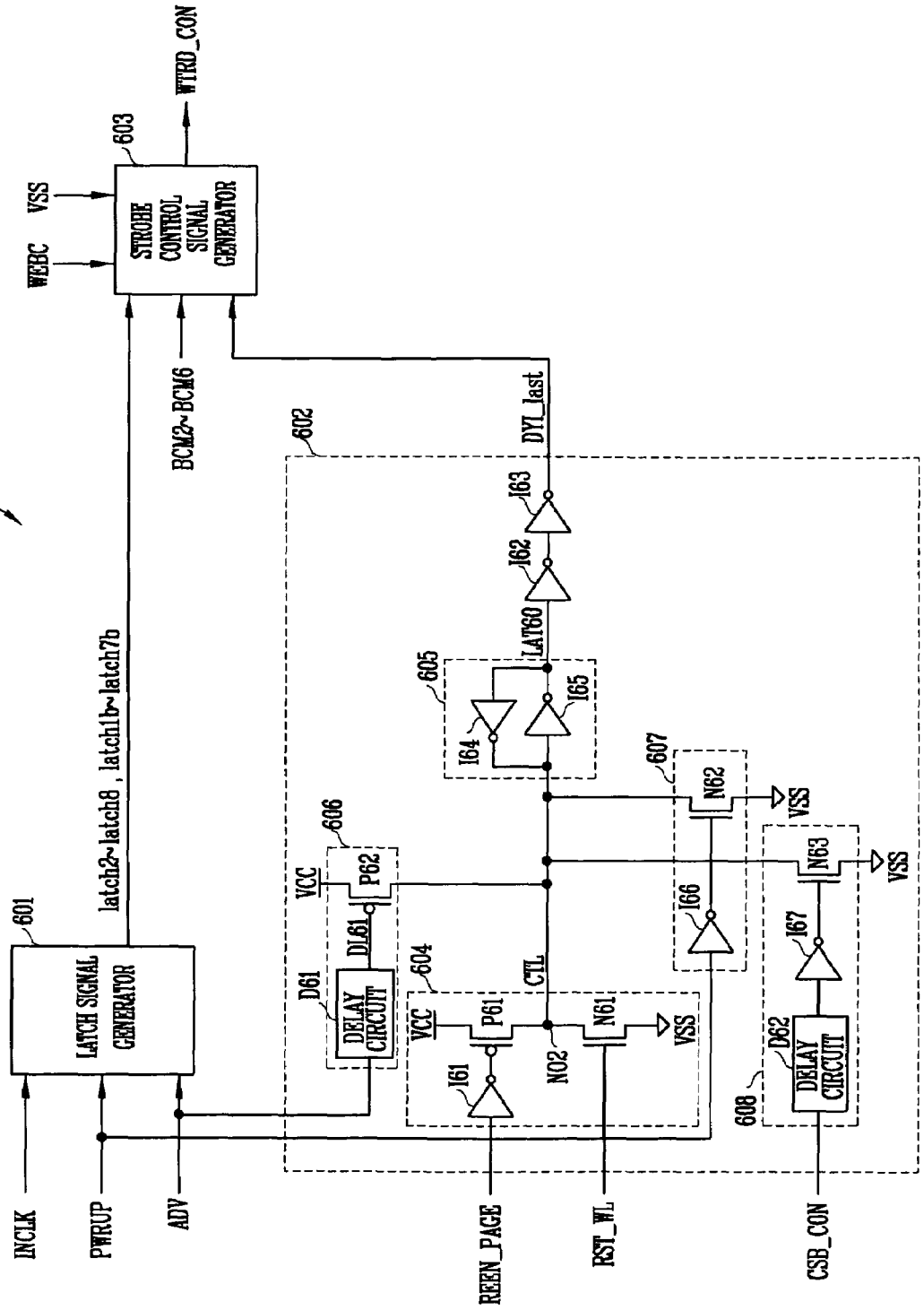
FIG. 10 is a detailed circuit diagram of a first burst control circuit shown in FIG. 2.

FIG. 10 is a detailed circuit diagram of the first burst control circuit 600 shown in FIG. 2.

Referring to FIG. 10, the first burst control circuit 600 includes a latch signal generator 601, a control circuit 602 and a strobe control signal generator 603.

The latch signal generator 601 generates latch signals (latch2 to latch8, latch1b to latch7b) in response to the internal clock signal (INCLK), the power-up detection signal (PWRUP) and the internal address valid signal (ADV).

The control circuit 602 includes a driver circuit 604, a latch circuit 605, inverters I62 and I63 and latch reset circuits 606 to 608.

The driver circuit 604 includes an inverter I61, a PMOS transistor P61 and an NMOS transistor N61. The driver circuit 604 outputs a control signal (CTL) of logic high or logic low to the output node NO2 in response to the first detection signal (RST_WL) and the second detection signal (REEN_PAGE).

In more detail, the inverter I61 inverts the second detection signal (REEN_PAGE) received from the column address detector 300. The PMOS transistor P61 is turned on or off in response to the output signal of the inverter I61. The NMOS transistor N61 is turned on or off in response to the first detection signal (RST_WL) received from the column address detector 300.

When the second detection signal (REEN_PAGE) is logic high, the PMOS transistor P61 is turned on to output the control signal (CTL) to the output node NO2 as logic high. Furthermore, when the first detection signal (RST_WL) is logic high, the NMOS transistor N61 is turned on to output the control signal (CTL) to the output node NO2 as logic low. When any one of the first detection signal (RST_WL) and the second detection signal (REEN_PAGE) is logic high, the other one is logic low. Therefore, one of the PMOS transistor P61 and the NMOS transistor N61 is turned on. As a result, the driver circuit 604 outputs the control signal (CTL) of logic high or logic low.

The latch circuit 605 includes inverters I64 and I65. The latch circuit 605 latches the control signal (CTL) and outputs the latched signal (LAT60). The inverters I62 and I63 delay the latched signal (LAT60) and output the delayed signal as a last column detection signal (DYI_last).

The latch reset circuit 606 includes a delay circuit D61 and a PMOS transistor P62. The delay circuit D61 delays the internal address valid signal (ADV) and outputs the delayed signal (DL61). The construction and operation of the delay circuit D61 are substantially the same as those of the aforementioned delay circuit D251, which have been described with reference to FIGS. 4 and 5. Description thereof is omitted.

The PMOS transistor P62 is turned on or off in response to the delayed signal (DL61). When the PMOS transistor P62 is turned on, it outputs the internal voltage (VCC) to the latch circuit 605. As a result, the latch circuit 605 is reset to output the latched signal (LAT60) as logic low.

Furthermore, the latch reset circuit 607 includes an inverter I66 and an NMOS transistor N62. The inverter I66 inverts the power-up detection signal (PWRUP). The NMOS transistor N62 is turned on or off in response to the output signal of the inverter I66. When the inverter I66 is turned on, it outputs the ground voltage (VSS) to the latch circuit 605. As a result, the latch circuit 605 is reset to output the latched signal (LAT60) as logic high.

Furthermore, the latch reset circuit 608 includes a delay circuit D62, an inverter I67 and an NMOS transistor N63.

The delay circuit D62 delays the control signal (CSB_CON) received from the buffer unit 200 and outputs a delayed signal (DL62). The construction and operation of the delay circuit D62 are substantially the same as those of the aforementioned delay circuit D251, which have been described with reference to FIGS. 4 and 5. Description thereof is omitted.

The inverter I67 inverts the delayed signal (DL62).

The NMOS transistor N63 is turned on or off in response to the output signal of the inverter I67. When the NMOS transistor N63 is turned on, it outputs the ground voltage (VSS) to the latch circuit 605. As a result, the latch circuit 605 is reset to output the latched signal (LAT60) as logic high.

The strobe control signal generator 603 generates the strobe control signal (WTRD_CON) in response to the latch signals (latch2 to latch8, latch1b to latch7b) and the last column detection signal (DYI_last).

Figure 11:
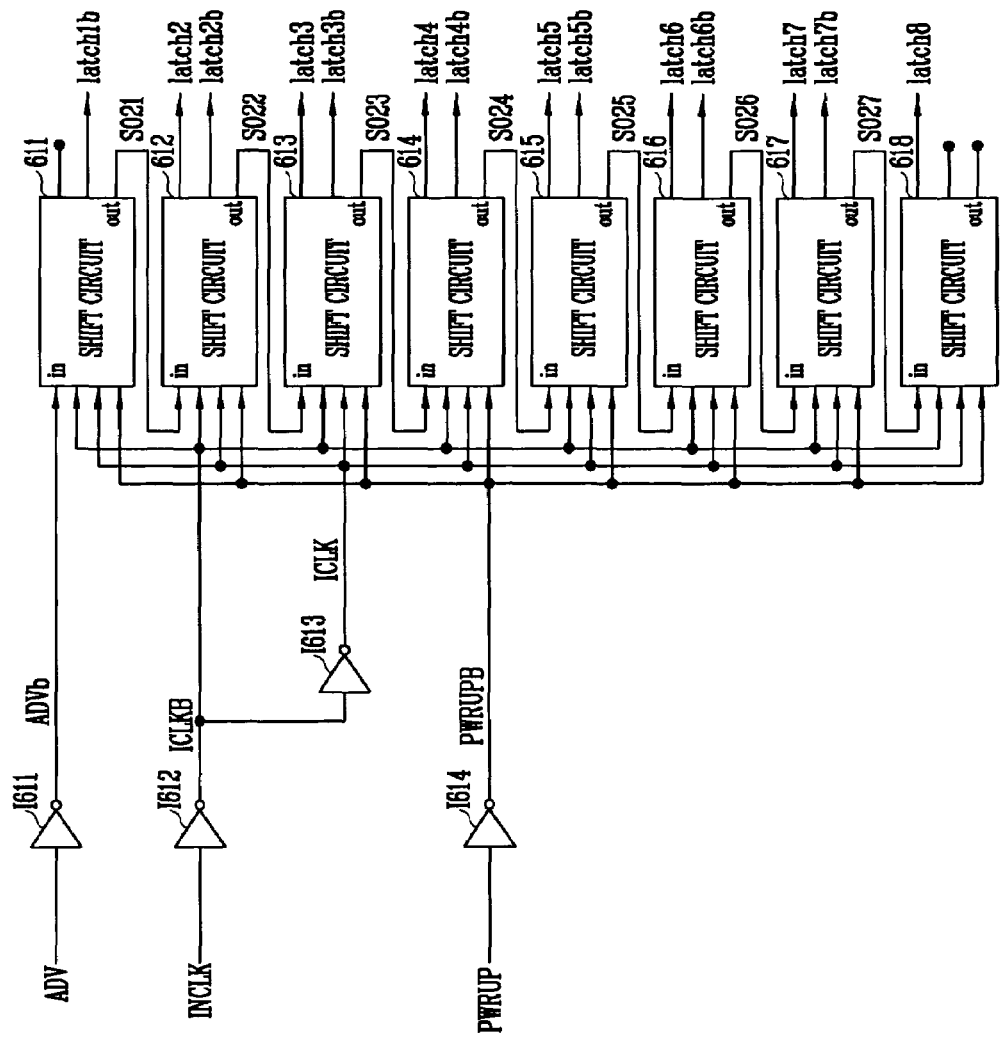
FIG. 11 is a detailed circuit diagram of a latch signal generator shown in FIG. 10.

FIG. 11 is a detailed circuit diagram of the latch signal generator 601 shown in FIG. 10.

Referring to FIG. 11, the latch signal generator 601 includes inverters I611 to I614 and shift circuits 611 to 618.

The inverter I611 inverts the internal address valid signal (ADV) and outputs an inverted internal address valid signal (ADVb).

The inverter I612 inverts the internal clock signal (INCLK) and outputs the inverted signal. The signal inverted by the inverter I612 is substantially the same as the inverted control clock signal (ICLKB) generated by the control clock generating circuit 310. Therefore, the signal inverted by the inverter I612 will be hereinafter referred to as the inverted control clock signal (ICLKB).

Inverter I613 inverts the inverted control clock signal (ICLKB) and outputs the control clock signal (ICLK). The control clock signal (ICLK) has the same phase as that of the external clock signal (EXCLK).

The inverter I614 inverts the power-up detection signal (PWRUP) and outputs the inverted power-up detection signal (PWRUPB).

The shift circuits 611 to 618 are connected in series. For example, an output terminal (out) of the shift circuit 611 can be connected an input terminal (in) of the shift circuit 612. The output terminal (out) of the shift circuit 612 can be connected an input terminal (in) of the shift circuit 613 and so on.

The control clock signal (ICLK) and the inverted control clock signal (ICLKB) are input to the shift circuits 611 to 618 at the same time. The shift circuits 611 to 618 are reset in response to the inverted power-up detection signal (PWRUPB).

An input terminal (in) of the shift circuit 611 is input the inverted internal address valid signal (ADVb). The shift circuit 611 outputs a shift signal (SO21) and a latch signal (latch1b) in response to the inverted internal address valid signal (ADVb), the control clock signal (ICLK) and the inverted control clock signal (ICLKB).

To an input terminal (in) of the shift circuit 612 is input the shift signal (SO21). The shift circuit 612 outputs a shift signal (SO22) and latch signals (latch2 and latch2b) in response to the shift signal (SO21), the control clock signal (ICLK) and the inverted control clock signal (ICLKB). The shift circuits 613 to 618 operate in the same manner as the shift circuit 612 and output shift signals (SO23 to SO25) and latch signals (latch3 to latch8, latch3b to latch7b), respectively.

Figure 12:
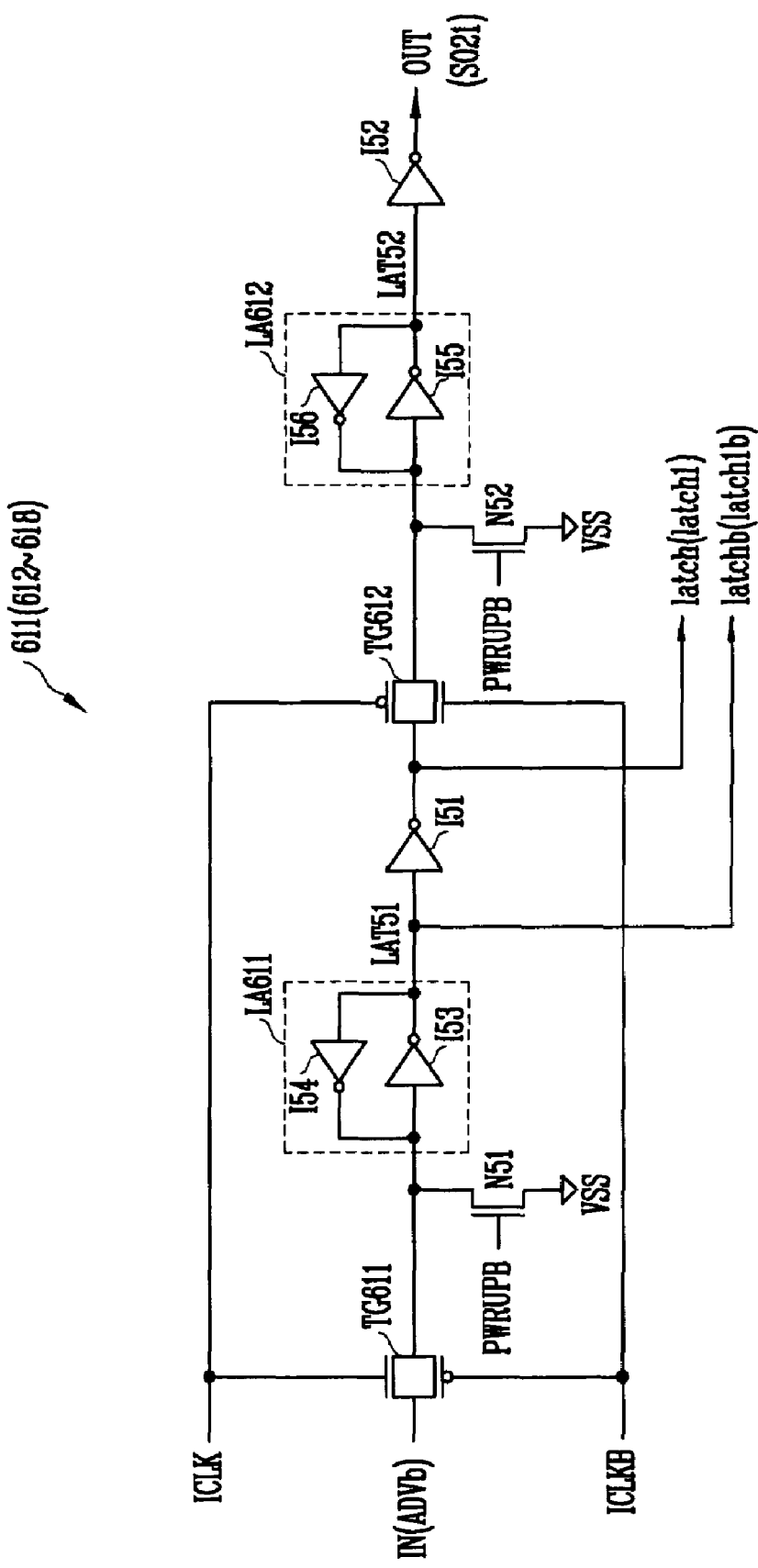
FIG. 12 is a detailed circuit diagram of a shift circuit shown in FIG. 11.

FIG. 12 is a detailed circuit diagram of the shift circuit shown in FIG. 11. The construction and operation of the shift circuits 611 to 618 are substantially the same. Therefore, only the shift circuit 611 is described as an example.

Referring to FIG. 12, the shift circuit 611 includes pass gates TG611 and TG612, latch circuits LA611, LA612, inverters I51, I52 and latch reset circuits N51 and N52. The construction and operation of the shift circuit 611 are the same as those of the aforementioned shift circuit 331, which have been described with reference to FIG. 9, except for several points. Therefore, only the differences is described as an example.

The shift circuit 611 is different from the shift circuit 331 in that the inverter I51 is connected between the latch circuit LA611 and the pass gate TG612 instead of the NOR gate NR331 of the shift circuit 331. The shift circuit 611 and the shift circuit 331 are also different from each other in the signals input to the pass gates TG611 and TG331. Meanwhile, the latch circuit LA611 outputs the latched signal (LAT51) as a latch signal (latchb) (i.e., latch1b). Furthermore, the inverter I51 inverts the latched signal (LAT51) and outputs the inverted signal as a latch signal (latch) (i.e., latch1).

Figure 13:
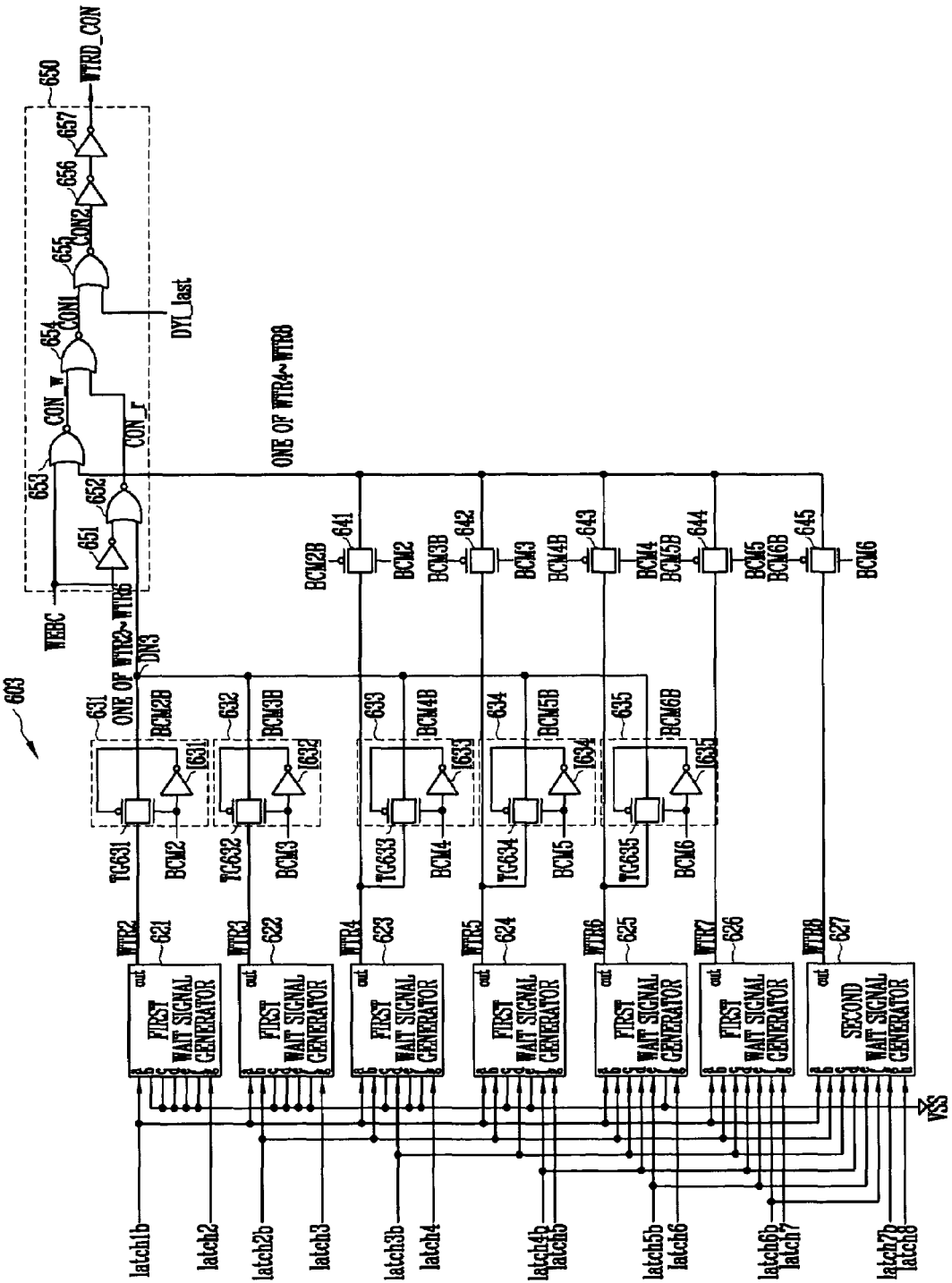
FIG. 13 is a detailed circuit diagram of a strobe control signal generator shown in FIG. 10.

FIG. 13 is a detailed circuit diagram of the strobe control signal generator shown in FIG. 10. FIG. 13 shows an example of the strobe control signal generator 603 to which the latency control signals (BCM2 to BCM6) are applied.

Referring to FIG. 13, the strobe control signal generator 603 includes first wait signal generators 621 to 626, a second wait signal generator 627, pass circuits 631 to 635, pass gates 641 to 645 and an output logic circuit 650. Each of the first wait signal generators 621 to 626 includes input terminals (a to g) and an output terminal (out). The second wait signal generator 627 includes input terminals (a to h) and an output terminal (out).

The first wait signal generator 621 receives a latch signal (latch1b) through the input terminal (a) and receives the latch signal (latch2) through the input terminal (g). Furthermore, to the input terminals (b to f) of the first wait signal generator 621 is input a ground voltage (VSS). The first wait signal generator 621 generates a wait signal (WTR2) in response to latch signals (latch1b, latch2).

The first wait signal generator 622 receives the latch signal (latch1b) through the input terminal (a), a latch signal (latch2b) through the input terminal (b), and a latch signal (latch3) through the input terminal (g). Furthermore, the ground voltage (VSS) is input to the input terminals (c to f) of the first wait signal generator 622. The first wait signal generator 622 generates a wait signal (WTR3) in response to the latch signals (latch1b, latch2b, latch3).

Furthermore, the first wait signal generator 623 receives the latch signal (latch1b) through the input terminal (a), the latch signal (latch2b) through the input terminal (b), a latch signal (latch3b) through the input terminal (d), and a latch signal (latch4) through the input terminal (g). The ground voltage (VSS) is input to the other input terminals (c, e, f) of the first wait signal generator 623. The first wait signal generator 623 generates a wait signal (WTR4) in response to the latch signals (latch1b, latch2b, latch3b and latch4).

The first wait signal generator 624 receives the latch signal (latch1b) through the input terminal (a), the latch signal (latch2b) through the input terminal (b), the latch signal (latch3b) through the input terminal (d), a latch signal (latch4b) through the input terminal (f), and a latch signal (latch5) through the input terminal (g). The ground voltage (VSS) is input to the other input terminals (c, e) of the first wait signal generator 624. The first wait signal generator 624 generates a wait signal (WTR5) in response to the latch signals (latch1b, latch2b, latch3b, latch4b, latch5).

The first wait signal generator 625 receives the latch signal (latch1*b*) through the input terminal (a), the latch signal (latch2*b*) through the input terminal (b), the latch signal (latch3*b*) through the input terminal (c), the latch signal (latch4*b*) through the input terminal (d), a latch signal (latch5*b*) through the input terminal (e), and the latch signal (latch6) through the input terminal (g). To the input terminal (f) of the first wait signal generator 625 is input the ground voltage (VSS). The first wait signal generator 625 generates a wait signal (WTR6) in response to the latch signals (latch 1*b*, latch2*b*, latch3*b*, latch4*b*, latch5*b* and latch6).

The first wait signal generator 626 receives the latch signal (latch1*b*) through the input terminal (a), the latch signal (latch2*b*) through the input terminal (b), the latch signal (latch3*b*) through the input terminal (c), the latch signal (latch4*b*) through the input terminal (d), the latch signal (latch5*b*) through the input terminal (e), a latch signal (latch6*b*) through the input terminal (f) and a latch signal (latch7) through the input terminal (g). The first wait signal generator 626 generates a wait signal (WTR7) in response to the latch signals (latch1*b*, latch2*b*, latch3*b*, latch4*b*, latch5*b*, latch6*b* and latch7).

The second wait signal generator 627 receives the latch signal (latch1*b*) through the input terminal (a), the latch signal (latch2*b*) through the input terminal (b), the latch signal (latch3*b*) through the input terminal (c), the latch signal (latch4*b*) through the input terminal (d), the latch signal (latch5*b*) through the input terminal (e), the latch signal (latch6*b*) through the input terminal (f), a latch signal (latch7*b*) through the input terminal (g) and a latch signal (latch8) through the input terminal (h). The second wait signal generator 627 generates a wait signal (WTR8) in response to the latch signals (latch1*b*, latch2*b*, latch3*b*, latch4*b*, latch5*b*, latch6*b*, latch7*b* and latch8).

The pass circuits 631 to 635 are connected to the output terminals (out) of the first wait signal generators 621 to 625, respectively. Each of the pass circuits 631 to 635 includes a pass gate (one of TG631 to TG635) and an inverter (one of I631 to I635). For example, the pass circuit 631 can include the pass gate TG631 and the inverter I631.

The inverters I631 to I635 invert the latency control signals (BCM2 to BCM6), respectively, and output the inverted latency control signals (BCM2B to BCM6B), respectively. The pass gates TG631 to TG635 are turned on or off in response to the latency control signals (BCM2 to BCM6) and the inverted latency control signals (BCM2B to BCM6B), respectively.

For example, the pass gate TG631 can be turned on or off in response to the latency control signal (BCM2) and the inverted latency control signal (BCM2B). When the pass circuits 631 to 635 are enabled (i.e., the pass gates TG631 to TG635 are turned on), they output the wait signals (WTR2 to WTR6) to the node DN3. In more detail, one of the latency control signals (BCM2 to BCM6) is enabled and the remaining signals are disabled. Therefore, one of the pass circuits 631 to 635 is enabled to output a wait signal (one of WTR2 to WTR6), which is received from a corresponding one of the first wait signal generators 621 to 625, to the node DN3.

The pass gates 641 to 645 are respectively connected to the first wait signal generators 623 to 626 and the second wait signal generator 627. The pass gates 641 to 645 are turned on or off in response to the latency control signals (BCM2 to BCM6) and the inverted latency control signals (BCM2B to BCM6B), respectively. When the pass gates 641 to 645 are turned on, they output the wait signals (WTR4 to WTR8) to the output logic circuit 650.

In more detail, one of the latency control signals (BCM2 to BCM6) is enabled the remaining signals are disabled. Therefore, one of the pass gates 641 to 645 is turned on to output a received wait signal (one of WTR4 to WTR8) to the output logic circuit 650.

The output logic circuit 650 includes inverters 651, 656, and 657 and NOR gates 652 to 655.

The inverter 651 inverts the internal write control signal (WEBC). The NOR gate 652 outputs a read strobe control signal (CON_r) in response to the output signal of the inverter 651 and a wait signal (one of WTR2 to WTR6) received from the node DN3. When both the output signal of the inverter 651 and the wait signal (one of WTR2 to WTR6) are logic low, the NOR gate 652 outputs the read strobe control signal (CON_r) as logic high.

The NOR gate 653 outputs a write strobe control signal (CON_w) in response to the internal write control signal (WEBC) and a wait signal (one of WTR4 to WTR8) received from the pass gates 641 to 645.

The NOR gate 654 outputs a logic signal (CON1) in response to the read strobe control signal (CON_r) and the write strobe control signal (CON_w).

The NOR gate 655 outputs a logic signal (CON2) in response to the logic signal (CON1) and a last column detection signal (DYI_last) received from the control circuit 602.

The inverters 656 and 657 delay the logic signal (CON2). The inverter 657 outputs the delayed signal as the strobe control signal (WTRD_CON).

Figure 14:
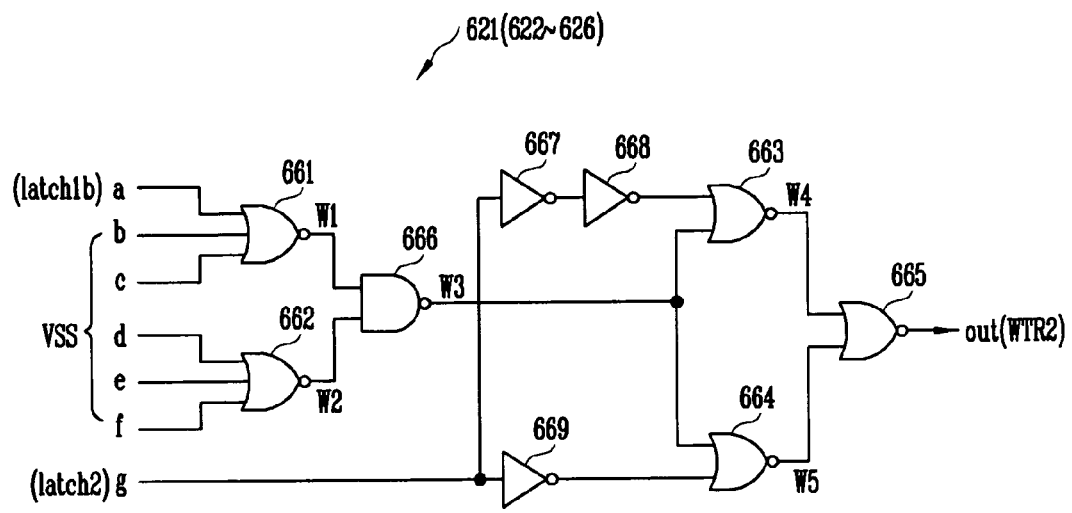
FIG. 14 is a detailed circuit diagram of a first wait signal generator shown in FIG. 13.

FIG. 14 is a detailed circuit diagram of the first wait signal generator shown in FIG. 13.

The construction and operation of the first wait signal generators 621 to 626 are substantially the same except for their input signals and output signals. Only the first wait signal generator 621 is described as an example.

Referring to FIG. 14, the first wait signal generator 621 includes NOR gates 661 to 665, a NAND gate 666 and inverters 667 to 669.

The NOR gate 661 outputs a logic signal (W1) in response to the latch signal (latch1*b*) and the ground voltage (VSS) respectively received through input terminals (a to c). The NOR gate 661 outputs the logic signal (W1) as logic high when the latch signal (latch1*b*) is logic low. The NOR gate 662 outputs the logic signal (W2) as high level in response to the ground voltage (VSS) received through input terminals (d to f).

The NAND gate 666 outputs a logic signal (W3) in response to the logic signals (W1 and W2). When both the logic signals (W1 and W2) are logic high, the NAND gate 666 outputs the logic signal (W3) as logic low.

The inverters 667 and 668 delay the latch signal (latch2) received through the input terminal (g). The inverter 669 delays the latch signal (latch2) received through the input terminal (g).

The NOR gate 663 outputs a logic signal (W4) in response to the output signal of the inverter 668 and the logic signal (W3). Furthermore, the NOR gate 664 outputs a logic signal (W5) in response to the output signal of the inverter 669 and the logic signal (W3). The NOR gate 665 outputs a wait signal (WTR2) to the output terminal (out) in response to the logic signals (W4 and W5).

Figure 15:
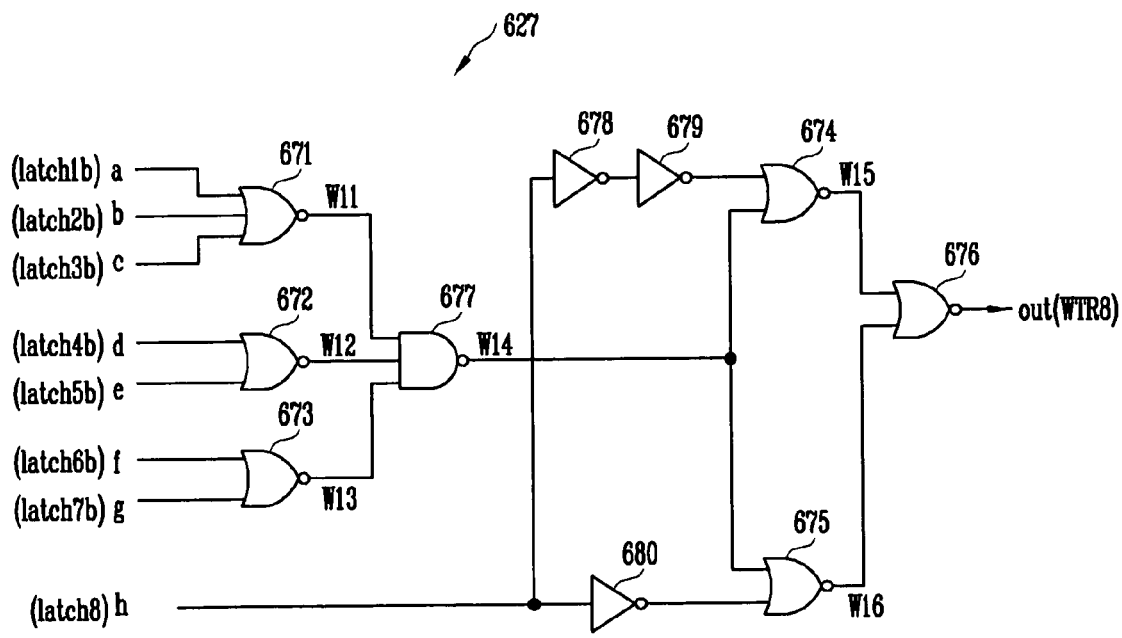
FIG. 15 is a detailed circuit diagram of a second wait signal generator shown in FIG. 13.

FIG. 15 is a detailed circuit diagram of the second wait signal generator 627 shown in FIG. 13.

Referring to FIG. 15, the second wait signal generator 627 includes NOR gates 671 to 676, a NAND gate 677 and inverters 678 to 680. The construction and operation of the second wait signal generator 627 is the same as those of the aforementioned first wait signal generator 621, which has been described with reference to FIG. 14, except for the NOR gate 673. Description thereof is omitted.

The NOR gate 671 includes input terminals (a to c). The NOR gate 672 includes input terminals (d, e). The NOR gate 673 includes input terminals (f, g). Furthermore, the inverters 678 and 680 are connected to an input terminal (h). The NAND gate 677 receives logic signals (W11 to W13) from the NOR gates 671 to 673.

Figure 16:
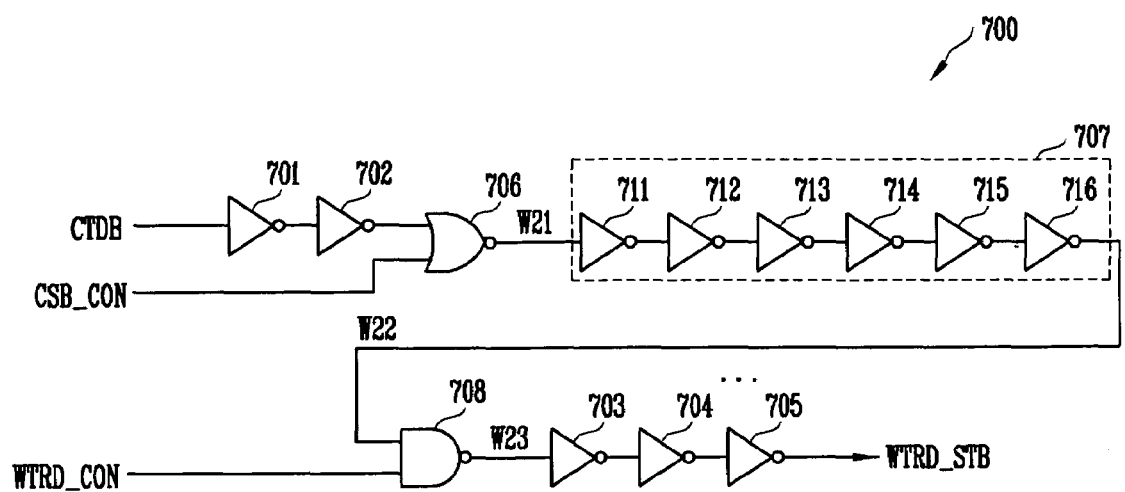
FIG. 16 is a detailed circuit diagram of a second burst control circuit shown in FIG. 2.

FIG. 16 is a detailed circuit diagram of the second burst control circuit 700 shown in FIG. 2.

Referring to FIG. 16, the second burst control circuit 700 includes inverters 701 to 705, a NOR gate 706, a delay circuit 707 and a NAND gate 708.

The inverters 701 and 702 delay the control signal (CTDB) received from the buffer unit 200. The NOR gate 706 outputs a logic signal (W21) in response to the output signal of the inverter 702 and a control signal (CSB_CON) received from the buffer unit 200. The delay circuit 707 includes inverters 711 to 716 that are connected in series. The inverters 711 to 716 delay the logic signal (W21) and output a delayed signal (W22).

Furthermore, the NAND gate 708 outputs a logic signal (W23) in response to the strobe control signal (WTRD_CON) received from the first burst control circuit 600 and the logic signal (W21). The inverters 703 to 705 delay the logic signal (W23) and output the delayed signal as the burst operation control signal (WTRD_STB).

Figure 17:
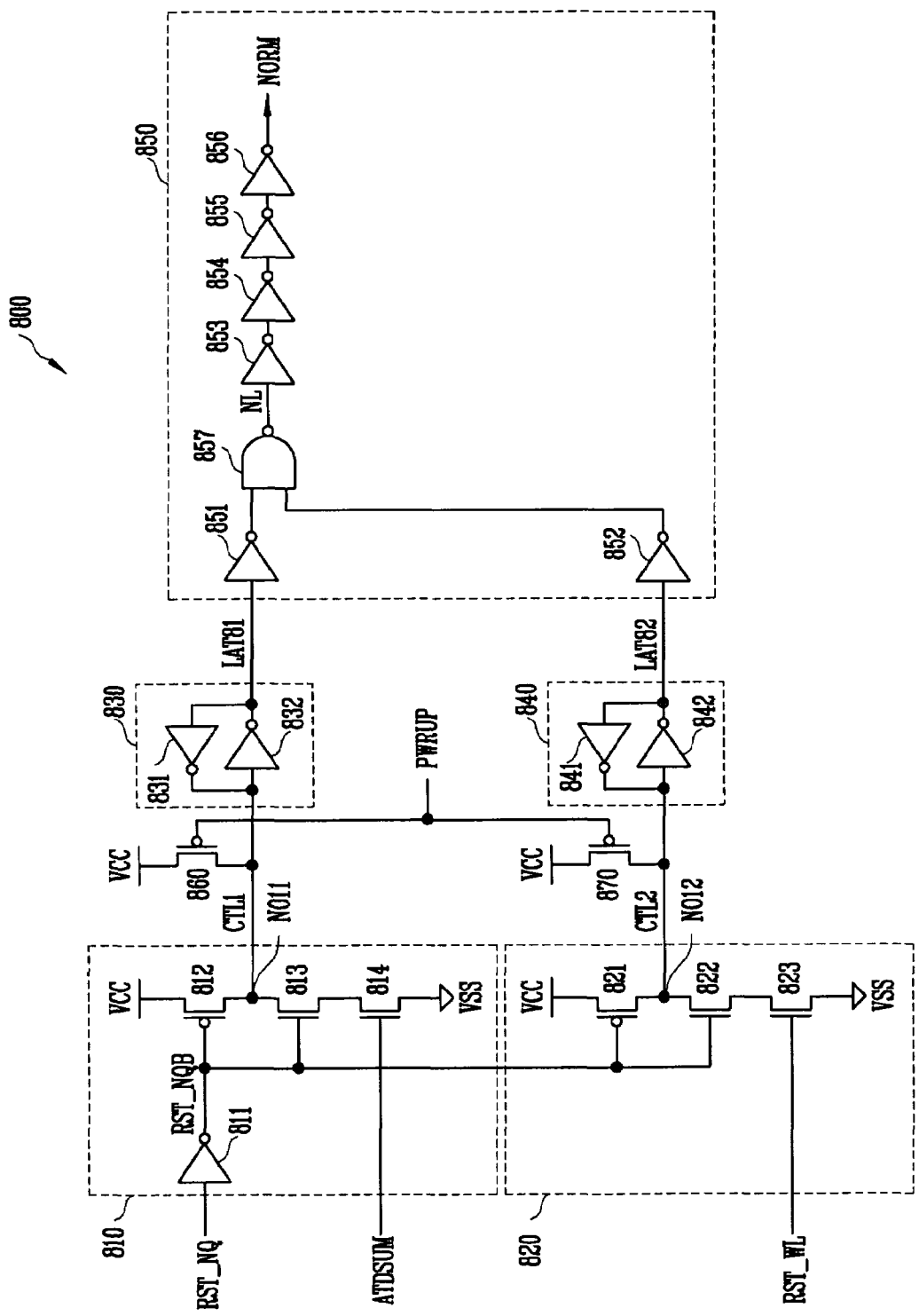
FIG. 17 is a detailed circuit diagram of a first word line control circuit shown in FIG. 2.

FIG. 17 is a detailed circuit diagram of the first word line control circuit 800 shown in FIG. 2.

Referring to FIG. 17, the first word line control circuit 800 includes driver circuits 810 and 820, latch circuits 830 and 840, an output logic circuit 850 and latch reset circuits 860, 870.

The driver circuit 810 includes an inverter 811, a PMOS transistor 812 and NMOS transistors 813 and 814. The driver circuit 810 outputs a control signal (CTL1) of a logic low or a logic high to an output node NO11 in response to the second internal control signal (RST_NQ) received from the second word line control circuit 900 and the address shift detection signal (ATDSUM) received from the buffer unit 200.

In more detail, the inverter 811 inverts the second internal control signal (RST_NQ) and outputs an inverted second internal control signal (RST_NQB).

The PMOS transistor 812 is turned on or off in response to the inverted second internal control signal (RST_NQB). When the PMOS transistor 812 is turned on to supply the internal voltage (VCC) to the output node NO11. As a result, the control signal (CTL1) of logic high is generated in the output node NO11.

The NMOS transistors 813 and 814 are connected in series between the output node NO11 and the ground voltage (VSS). The NMOS transistor 813 is turned on or off in response to the inverted second internal control signal (RST_NQB). The NMOS transistor 814 is turned on or off in response to the address shift detection signal (ATDSUM). When the PMOS transistor 812 is turned on, the NMOS transistor 813 is turned off. The NMOS transistors 813 and 814 are turned on to supply the ground voltage (VSS) to the output node NO11. As a result, the control signal (CTL1) of logic low is generated in the output node NO11.

The driver circuit 820 includes a PMOS transistor 821 and NMOS transistors 822, 823.

The driver circuit 820 outputs a control signal (CTL2) of logic low or logic high to an output node NO12 in response to the inverted second internal control signal (RST_NQB) and the first detection signal (RST_WL) received from the column address detector 300. In more detail, the PMOS transistor 821 and the NMOS transistor 822 are turned on or off in response to the inverted second internal control signal (RST_NQB). The construction and operation of the driver circuit 820 are the same as those of the driver circuit 810.

The latch circuit 830 includes inverters 831 and 832. The latch circuit 830 latches the control signal (CTL1) and outputs a latched signal (LAT81). The latch circuit 840 includes inverters 841 and 842. The latch circuit 840 latches the control signal (CTL2) and outputs a latched signal (LAT82). The output logic circuit 850 includes inverters 851 to 856 and an NAND gate 857.

The inverter 851 inverts the latched signal (LAT81) and the inverter 852 inverts the latched signal (LAT82). The NAND gate 857 outputs a logic signal (NL) in response to the output signals of the inverters 851 and 852. The inverters 853 to 856 delay the logic signal (NL) and output the delayed signal as the first internal control signal (NORM).

The latch reset circuits 860 and 870 supply the internal voltage (VCC) to the latch circuits 830 and 840 in response to the power-up detection signal (PWRUP). As a result, the latch circuits 830 and 840 are reset to output the latched signals (LAT81 and LAT82) as logic low. Each of the latch reset circuits 860 and 870 can be implemented using a PMOS transistor.

Figure 18:
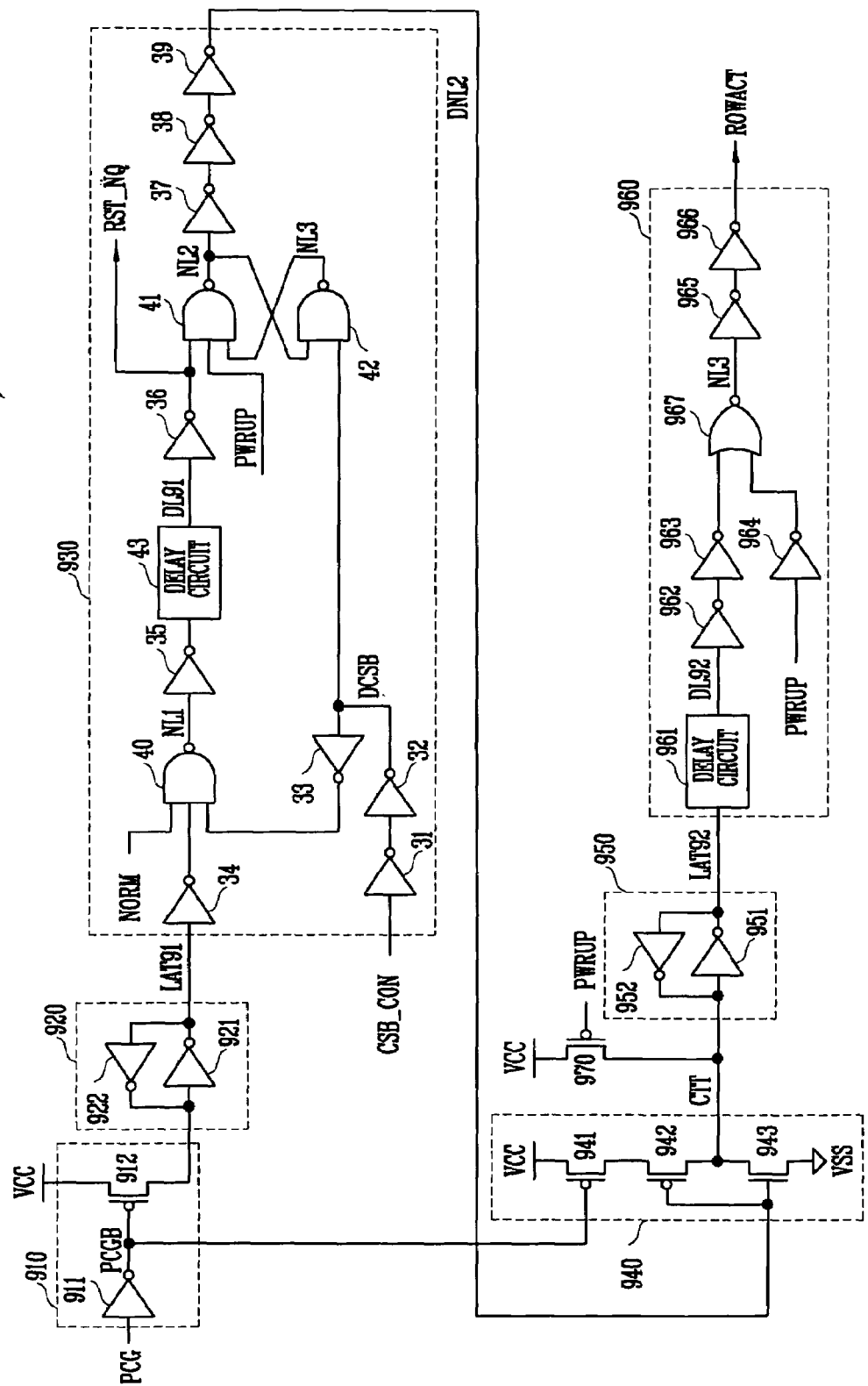
FIG. 18 is a detailed circuit diagram of a second word line control circuit shown in FIG. 2.

FIG. 18 is a detailed circuit diagram of the second word line control circuit 900 shown in FIG. 2. Referring to FIG. 18, the second word line control circuit 900 includes latch reset circuits 910 and 970, latch circuits 920 and 950, a driver circuit 940, a first output logic circuit 930 and a second output logic circuit 960.

The latch reset circuit 910 includes an inverter 911 and a PMOS transistor 912. The inverter 911 inverts the precharge control signal (PCG) and outputs an inverted precharge control signal (PCGB). The PMOS transistor 912 is turned on or off in response to the inverted precharge control signal (PCGB). The PMOS transistor 912 is turned on to output the internal voltage (VCC) to the latch circuit 920.

The latch circuit 920 includes inverters 921 and 922. The latch circuit 920 is latched by the latch reset circuit 910 and outputs a latched signal (LAT91) of logic low.

The first output logic circuit 930 includes inverters 31 to 39, NAND gates 40 to 42 and a delay circuit 43. The inverters 31 and 32 delay the control signal (CSB_CON) received from the buffer unit 200 and outputs a delayed signal (DCSB). The inverter 33 delays the delayed signal (DCSB). The inverter 34 inverts the latched signal (LAT91). The NAND gate 40 outputs a logic signal (NL1) in response to the first internal control signal (NORM) and the output signals of the inverters 33 and 34. The inverter 35 inverts the logic signal (NL1). The delay circuit 43 delays the output signal of the inverter 35 and outputs a delayed signal (DL91). The construction and operation of the delay circuit 43 are substantially the same as those of the aforementioned delay circuit D251 that has been described with reference to FIGS. 4 and 5. Description thereof is omitted.

The inverter 36 inverts the delayed signal (DL91) and outputs the inverted signal as a second internal control signal (RST_NQ). The NAND gate 41 outputs a logic signal (NL2) in response to the second internal control signal (RST_NQ), the power-up detection signal (PWRUP) and a logic signal (NL3). The NAND gate 42 outputs the logic signal (NL3) in response to the logic signal (NL2) and the delayed signal (DCSB). The inverters 37 to 39 delay the logic signal (NL2) and output a delayed signal (DNL2).

The driver circuit 940 includes PMOS transistors 941 and 942 and a NMOS transistor 943. The driver circuit 940 outputs a control signal (CTT) of logic low or logic high to an output node NO21 in response to an inverted precharge control signal (PCGB) and the delayed signal (DNL2). In more detail, the PMOS transistor 941 is turned on or off in response to the inverted precharge control signal (PCGB). The PMOS transistor 942 is connected between the PMOS transistor 941 and the output node NO21 and is turned on or off in response to the delayed signal (DNL2). The PMOS transistors 941 and 942 are turned on to supply the internal voltage (VCC) to the output node NO21. As a result, the control signal (CTT) of logic high is generated in the output node NO21. The NMOS transistor 943 is connected between the output node NO21 and the ground voltage (VSS). The NMOS transistor 943 is turned on or off in response to the delayed signal (DNL2). The NMOS transistor 943 is turned on to supply the ground voltage (VSS) to the output node NO21. As a result, the control signal (CTT) of logic low is generated in the output node NO21.

The latch circuit 950 includes inverters 951 and 952. The latch circuit 950 latches the control signal (CTT) and outputs a latched signal (LAT92).

The second output logic circuit 960 includes a delay circuit 961, inverters 962 to 966 and a NOR gate 967. The delay circuit 961 delays the latched signal (LAT92) and outputs a delayed signal (DL92). The construction and operation of the delay circuit 961 are substantially the same as those of the aforementioned delay circuit D251 that has been described with reference to FIGS. 4 and 5. Description thereof is omitted. The inverters 962 and 963 delay the delayed signal (DL92) and the inverter 964 inverts the power-up detection signal (PWRUP). The NOR gate 967 outputs a logic signal (NL3) in response to the output signals of the inverters 963 and 964. The inverters 965, 966 delay the logic signal (NL3) and output the delayed signal as the word line control signal (ROWACT).

Figure 19:
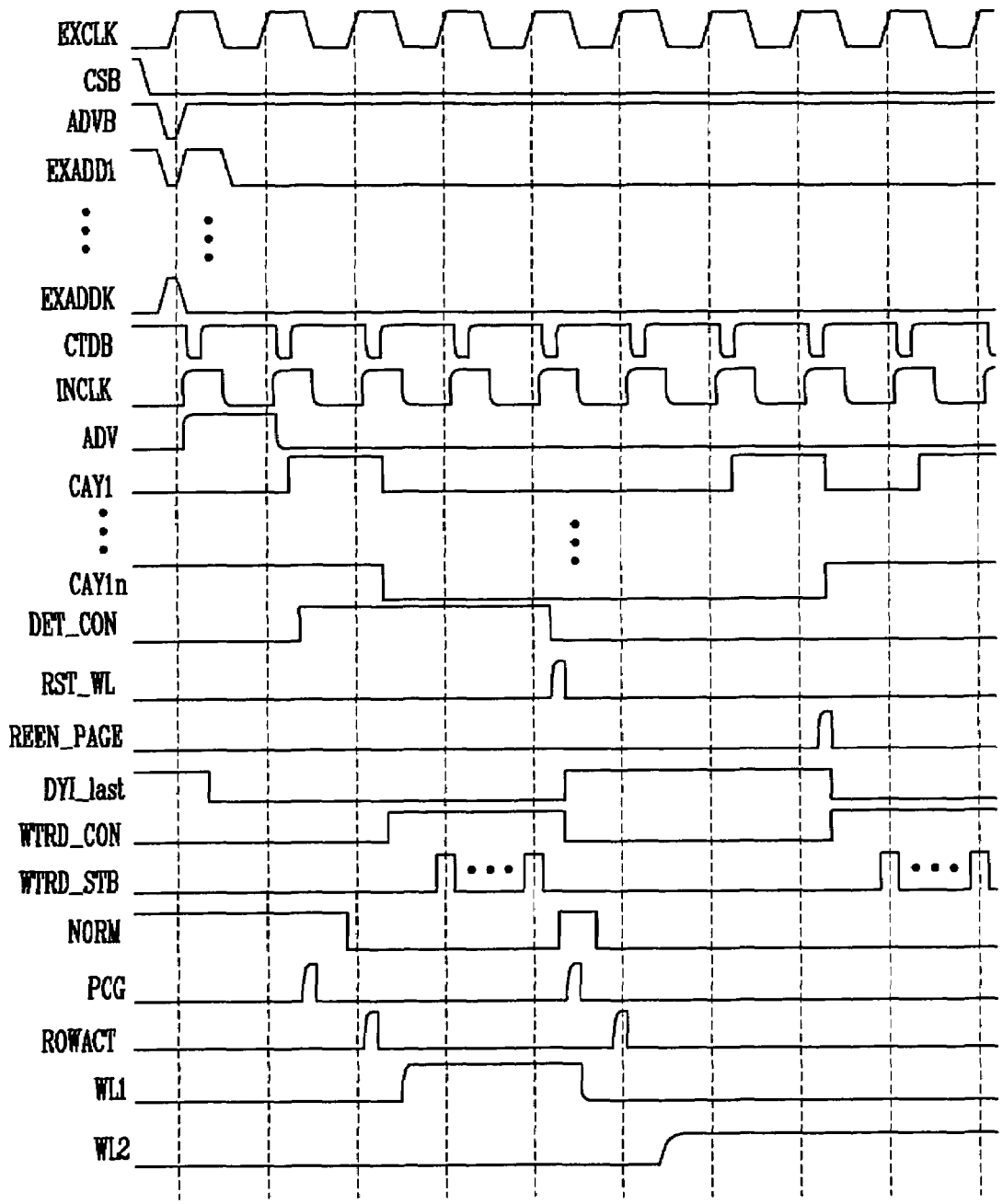
FIG. 19 is a timing diagram showing signals related to the burst read or write operation of the pseudo SRAM according to an embodiment of the present invention.

The burst read or write operation of the pseudo SRAM 100 will be described in detail below with reference to FIG. 19. FIG. 19 is a timing diagram showing signals related to the burst read or write operation of the pseudo SRAM 100 according to an embodiment of the present invention. The write operation of the pseudo SRAM 100 will be first described in detail below.

The chip select signal (CSB) and the write enable signal (WEB) are initially disabled to a low level. As a result, the pseudo SRAM 100 is enabled in response to the chip select signal (CSB) and the power-up detector 101 outputs the power-up detection signal (PWRUP) as logic high.

Thereafter, the buffer unit 200 of the burst mode controller 104 generates the internal clock signals (INCLK and INCLKB) and the control signal (CTDB) in response to the external clock signal (EXCLK) and outputs the control signal (CSB_CON) as low level in response to the chip select signal (CSB).

Furthermore, the buffer unit 200 outputs the internal write control signal (WEBC) as low level in response to the write enable signal (WEB), the internal clock signals (INCLK and INCLKB) and the control signal (CSB_CON). Furthermore, the buffer unit 200 receives the external address signals (EXADD1 to EXADDK) when the address valid signal (ADVB) becomes low level and generates the burst row address signals (CAX1 to CAXn) and the burst column address signals (CAY1 to CAYn) based on the external address signals (EXADD1 to EXADDK).

The buffer unit 200 continuously generates the burst row address signals (CAX1 to CAXn) and the burst column address signals (CAY1 to CAYn) until the address valid signal (ADVB) shifts from a logic high to a logic low or the chip select signal (CSB) becomes logic high. When the address valid signal (ADVB) shifts to a logic low, the buffer unit 200 receives new external address signals and generates burst row address signals and burst column address signals in response thereto.

Meanwhile, in the burst operation controller 400, the control circuit 602 of the first burst control circuit 600 initially outputs the last column detection signal (DYI_last) as logic low during a set time in response to the control signal (CSB_CON). When the last column detection signal (DYI_last) is a low level, the strobe control signal generator 603 of the first burst control circuit 600 enables the strobe control signal (WTRD_CON) as logic high. At this time, the strobe control signal generator 603 enables the strobe control signal (WTRD_CON) after a set delay time since a time point where the last column detection signal (DYI_last) becomes a logic low in response to the latency control signals (BCM2 to BCM6) and the latch signals (latch2 to latch8, latch1b to latch7b).

While the strobe control signal (WTRD_CON) is a high level, the second burst control circuit 700 of the burst operation controller 400 periodically and repeatedly generates the burst operation control signal (WTRD_STB) as a high pulse signal in response to the control signal (CTDB).

The main controller 102 initially generates the precharge control signal (PCG) as a high pulse after a set time elapses after the chip select signal (CSB) and the address valid signal (ADVB) are disabled to a logic low. The second word line control circuit 900 of the word line controller 500 outputs the word line control signal (ROWACT) as a pulse signal of logic high in response to the precharge control signal (PCG) and the power-up detection signal (PWRUP).

As a result, the read/write controller 105 enables the driver control signal (DRV_CON) in response to the word line control signal (ROWACT). Furthermore, the row decoder 107 decodes the burst row address signals (CAX1 to CAXn). The word line driver 108 enables a word line (e.g., WL1) corresponding to the decoded result of the row decoder 107 in response to the driver control signal (DRV_CON).

The column decoder 109 receives the burst column address signals (CAY1 to CAYn) whenever the burst operation control signal (WTRD_STB) is generated as a high pulse signal. The column decoder 109 enables corresponding bit lines in response to the received burst column address signals (CAY1 to CAYn).

Thereafter, when the burst column address signals (CAY1 to CAYn) represent a last column address (e.g., the burst column address signals (CAY1 to CAYn) are all logic '1'), the column address detector 300 generates the first detection signal (RST_WL) as a high pulse signal and generates the second detection signal (REEN_PAGE) as a high pulse signal after a set time elapses.

The control circuit 602 outputs the last column detection signal (DYI_last) as logic high in response to the first detection signal (RST_WL). The strobe control signal generator 603 disables the strobe control signal (WTRD_CON) in response to the last column detection signal (DYI_last). As a result, the second burst control circuit 700 continuously outputs the burst operation control signal (WTRD_STB) as logic low in response to the strobe control signal (WTRD_CON).

Furthermore, the first word line control circuit 800 outputs the first internal control signal (NORM) as logic high during a set time in response to the first detection signal (RST_WL). As a result, the main controller 102 outputs the precharge control signal (PCG) as a high pulse signal in response to the first internal control signal (NORM). The read/write controller 105 disables the driver control signal (DRV_CON) in response to the precharge control signal (PCG). The word line driver 108 disables the entire word lines in response to the driver control signal (DRV_CON).

Thereafter, the second word line control circuit 900 outputs the word line control signal (ROWACT) as a high pulse signal in response to the first internal control signal (NORM) and the precharge control signal (PCG). The read/write controller 105 enables the driver control signal (DRV_CON) again in response to the word line control signal (ROWACT). The word line driver 108 enables a next word line (e.g., WL2) corresponding to the result decoded by the row decoder 107 in response to the driver control signal (DRV_CON).

Thereafter, the control circuit 602 outputs the last column detection signal (DYI_last) as a logic low in response to the second detection signal (REEN_PAGE). The strobe control signal generator 603 enables the strobe control signal (WTRD_CON) again in response to the last column detection signal (DYI_last). As a result, the second burst control circuit 700 periodically and repeatedly generates the burst operation control signal (WTRD_STB) as a high pulse signal in response to the strobe control signal (WTRD_CON). Thereafter, the pseudo SRAM 100 repeatedly performs the above operation.

Meanwhile, the read operation of the pseudo SRAM 100 is the same as the write operation of the pseudo SRAM 100 except that the write enable signal (WEB) becomes logic high and a time point where each signal is output is different. Therefore, description on the read operation of the pseudo SRAM 100 is omitted in order to avoid redundancy.

As described above, the present invention is advantageous in that a pseudo SRAM can execute a continuous burst mode operation as an access command and an external address signal are input to a pseudo SRAM only once.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A pseudo SRAM comprising:
   a memory cell array including a plurality of DRAM cells;
   a burst mode controller which receives external address signals in response to an external clock signal and external control signals, continuously generates burst row address signals and burst column address signals based on the external address signals, and generates a burst operation control signal and a word line control signal in response to the external control signals, a precharge control signal and latency control signals;
   a read and write controller that generates a driver control signal in response to the word line control signal and the precharge control signal;
   a row decoder that decodes the burst row address signals;
   a word line driver that enables one of a plurality of word lines of the memory cell array, which corresponds to a result decoded by the row decoder or disables the plurality word lines of the memory cell array, in response to the driver control signal; and
   a column decoder that receives the burst column address signals in response to the burst operation control signal and enables bit lines of the memory cell array, which correspond to the burst column address signals.

2. The pseudo SRAM as claimed in claim 1, wherein the external control signals include an address valid signal, a chip select signal, a write enable signal and an output enable signal,
   wherein the address valid signal is disabled when the external address signals are input to the burst mode controller, and
   the burst mode controller receives the external address signals when the chip select signal and the address valid signal are disabled, generates the burst row address signals and the burst column address signals which gradually rise from the external address signals, and continuously generates the burst row address signals and the burst column address signals until the address valid signal is again disabled or the chip select signal is enabled.

3. The pseudo SRAM as claimed in claim 2, wherein the burst mode controller further includes a main controller that generates a first internal control signal in response to the external control signals, the precharge control signal and the latency control signals, generates the precharge control signal in response to the external control signals and the first internal control signal, and generates a mode register setting signal in response to the external control signals and the external address signals.

4. The pseudo SRAM as claimed in claim 3, further comprising a mode register that generates the latency control signals corresponding to a mode set by the mode register setting signal and the external address signals.

5. The pseudo SRAM as claimed in claim 3, wherein the main controller generates the precharge control signal as a high pulse signal after a set time elapses when the chip select signal and the address valid signal are disabled, and generates the precharge control signal as a high pulse signal when the first internal control signal becomes logic high.

6. The pseudo SRAM as claimed in claim 5, wherein the read and write controller enables the driver control signal when the word line control signal is enabled, and disables the driver control signal when the precharge control signal is enabled, and
   the word line driver enables one of a plurality of word lines of the memory cell array, which corresponds to the result decoded by the row decoder, whenever the driver control signal is enabled, and disables the plurality word lines of the memory cell away when the driver control signal is disabled.

7. The pseudo SRAM as claimed in claim 2, wherein the burst mode controller includes:
   a buffer unit that generates first and second control signals, an address shift detection signal, an internal clock signal, an internal write control signal, an internal address valid signal, the burst row address signals and the burst column address signals in response to the external clock signal, the external control signals and the external address signals;
   a column address detector that receives the internal clock signal, the internal write control signal, the internal address valid signal, the latency control signals and the burst column address signals, determines whether the burst column address signals represent a last column address, and generates a first detection signal and a second detection signal according to the determination result;
   a burst operation controller that generates the burst operation control signal in response to the first and second control signals, the internal clock signal, the internal write control signal, the internal address valid signal, the first detection signal, the second detection signal and the latency control signals; and
   a word line controller that generates a first internal control signal and the word line control signal in response to the address shift detection signal, the first detection signal, the second control signal and the precharge control signal.

8. The pseudo SRAM as claimed in claim 7, wherein the buffer unit includes:
an internal clock generating circuit that delays the external clock signal for a first predetermined time and generates a delayed signal, and delays the delayed signal for a second predetermined time to output the internal clock signal;
a control signal generating circuit that outputs the first and second control signals, the internal address valid signal and the internal write control signal in response to the external clock signal, the delayed signal, the chip select signal, the address valid signal and the write enable signal;
an address buffer that outputs internal row address signals, internal column address signals and the address shift detection signal in response to the chip select signal, the address valid signal, the internal clock signal and the external address signals; and
an address counter that outputs the burst row address signals and the burst column address signals in response to the internal clock signal, the internal row address signals and the internal column address signals.

9. The pseudo SRAM as claimed in claim 7, wherein the column address detector includes:
a control clock generating circuit that generates one of a read clock signal and a write clock signal and a control clock signal in response to the internal clock signal and the internal write control signal;
a last column detection circuit that outputs a valid shift detection signal and an internal detection signal in response to the internal address valid signal and the burst column address signals;
a first detection signal generator that outputs the first detection signal and an output signal in response to one of the read clock signal and the write clock signal, the control clock signal, the latency control signals, the internal detection signal and the valid shift detection signal; and
a second detection signal generator that outputs the second detection signal in response to one of the read clock signal and the write clock signal, the control clock signal, the latency control signals, the valid shift detection signal and the output signal.

10. The pseudo SRAM as claimed in claim 9, wherein the last column detection circuit outputs the internal detection signal as logic high when the internal address valid signal is logic low and the burst column address signals are all logic high.

11. The pseudo SRAM as claimed in claim 10, wherein the first detection signal generator outputs the first detection signal as a high pulse signal and the output signal as a logic high in synchronization with one of the read clock signal and the write clock signal after a first predetermined time elapses in response to the latency control signals when the internal detection signal is a logic high.

12. The pseudo SRAM as claimed in claim 9, wherein the buffer unit disables the internal write control signal when the write enable signal is disabled, and enables the internal write control signal when the write enable signal is enabled, and
the control clock generating circuit generates the write clock signal when the internal write control signal is disabled and generates the read clock signal when the internal write control signal is enabled.

13. The pseudo SRAM as claimed in claim 9, wherein the first detection signal generator includes:

a first shift circuit that generates a first shift signal in response to the internal detection signal, the valid shift detection signal and the control clock signal;
second to $J^{th}$ shift circuits that receive first to $(J-1)^{th}$ (J is an integer) shift signals, respectively, and output the second to $J^{th}$ shift signals, respectively, in response to the valid shift detection signal and the control clock signal;
first to $J^{th}$ pass circuits which receive the first to $(J-1)^{th}$ shift signals, respectively, are enabled or disabled in response to the latency control signals, and output the first to $(J-1)^{th}$ shift signals, which are received when being enabled, to an output node, respectively;
a $(J+1)^{th}$ shift circuit that outputs the output signal in response to one of the first to $J^{th}$ shift signals received from the output node, the valid shift detection signal and the control clock signal;
a $(J+2)^{th}$ shift circuit that outputs a $(J+1)^{th}$ shift signal in response to one of the first to $J^{th}$ shift signals received from the output node, the valid shift detection signal and the control clock signal;
a $(J+3)^{th}$ shift circuit that outputs a $(J+2)^{th}$ shift signal in response to the $(J+1)^{th}$ shift signal, the valid shift detection signal and the control clock signal; and
a detection signal output unit that outputs the $(J+2)^{th}$ shift signal or one of the first to $J^{th}$ shift signals, which are received from the output node, as the first detection signal, in response to one of the read clock signal and the write clock signal,
wherein when any one of the first to $J^{th}$ pass circuits is enabled, the remaining circuits are disabled.

14. The pseudo SRAM as claimed in claim 13, wherein the detection signal output unit outputs the $(J+2)^{th}$ shift signal as the first detection signal in response to the read clock signal, and outputs one of the first to $J^{th}$ shift signals received from the output node as the first detection signal in response to the write clock signal.

15. The pseudo SRAM as claimed in claim 11, wherein the second detection signal generator outputs the second detection signal as a high pulse signal in synchronization with one of the read clock signal and the write clock signal after a second predetermined time elapses in response to the latency control signals when the output signal is a logic high.

16. The pseudo SRAM as claimed in claim 9, wherein the second detection signal generator includes:
a first shift circuit that generates a first shift signal in response to the output signal, the valid shift detection signal and the control clock signal;
second to $L^{th}$ shift circuits that receive first to $(L-1)^{th}$ (L is an integer) shift signals, respectively, and output the second to $L^{th}$ shift signals, respectively, in response to the valid shift detection signal and the control clock signal;
first to $(L-1)^{th}$ pass circuits which receive the second to $L^{th}$ shift signals, respectively, are enabled or disabled in response to the latency control signals, and output the second to $L^{th}$ shift signals, which are received when being enabled, to an output node, respectively;
a $(L+1)^{th}$ shift circuit that outputs a $(L+1)^{th}$ shift signal in response to one of the second to $L^{th}$ shift signals received from the output node, the valid shift detection signal and the control clock signal;
a $(L+2)^{th}$ shift circuit that outputs a $(L+2)^{th}$ shift signal in response to the $(L+1)^{th}$ shift signal, the valid shift detection signal and the control clock signal; and
a detection signal output unit that outputs one of the second to $L^{th}$ shift signals received from the output node or the (L+2)$^{th}$ shift signal as the second detection signal in response to one of the read clock signal and the write clock signal,
wherein when one of the first to (L−1)$^{th}$ pass circuits is enabled, the remaining circuits are disabled.

17. The pseudo SRAM as claimed in claim 16, wherein the detection signal output unit outputs one of the second to L$^{th}$ shift signals received from the output node as the second detection signal in response to the read clock signal, and outputs the (L+2)$^{th}$ shift signal as the second detection signal in response to the write clock signal.

18. The pseudo SRAM as claimed in claim 7, wherein the burst operation controller includes:
    a first burst control circuit that generates a strobe control signal in response to the second control signal, the internal clock signal, the internal write control signal, the internal address valid signal, the first detection signal, the second detection signal and the latency control signals; and
    a second burst control circuit that generates the burst operation control signal in response to the first and second control signals and the strobe control signal.

19. The pseudo SRAM as claimed in claim 18, wherein the first burst control circuit enables the strobe control signal when the second detection signal is a high level, or enables the strobe control signal after a set time elapses when the internal address valid signal is a high level, and disables the strobe control signal when the first detection signal is a high level,
    the second burst control circuit generates a high pulse signal, which is periodically repeated, as the burst operation control signal in response to the first and second control signals when the strobe control signal is enabled, and
    whenever the second burst control circuit generates the burst operation control signal as a high pulse signal, the column decoder receives the burst column address signals in response to the burst operation control signal.

20. The pseudo SRAM as claimed in claim 18, wherein the first burst control circuit includes:
    a latch signal generator that generates latch signals in response to the internal clock signal and the internal address valid signal;
    a control circuit that outputs a last column detection signal in response to the internal address valid signal, the first and second detection signals and the second control signal; and
    a strobe control signal generator that outputs the strobe control signal in response to the internal write control signal, the latch signals, the latency control signals and the last column detection signal.

21. The pseudo SRAM as claimed in claim 20, wherein the latch signal generator includes:
    a first shift circuit that outputs a first shift signal and a first latch signal in response to an inverted signal of the internal address valid signal and an inverted signal of the internal clock signal;
    second to M$^{th}$ shift circuits that receive first to (M−1)$^{th}$ (M is an integer) shift signals, respectively, and output second to M$^{th}$ shift signals and second to M$^{th}$ latch signals, respectively, in response to the inverted signal of the internal clock signal; and
    a (M+1)$^{th}$ shift circuit that outputs a (M+1)$^{th}$ latch signal in response to the M$^{th}$ shift signal and the inverted signal of the internal clock signal.

22. The pseudo SRAM as claimed in claim 21, wherein the strobe control signal generator includes:
    first to (M−2)$^{th}$ wait signal generators that generate first to (M−2)$^{th}$ wait signals, respectively, in response to the first to (M−1)$^{th}$ latch signals;
    first to (M−2)$^{th}$ pass circuits, which receive the first to (M−2)$^{th}$ wait signals, respectively, are enabled or disabled in response to the latency control signals, and output the first to (M−2)$^{th}$ wait signals, which are received when being enabled, to the output node;
    a (M−1)$^{th}$ wait signal generator that generates a (M−1)$^{th}$ wait signal in response to the first to M$^{th}$ latch signals;
    a M$^{th}$ wait signal generator that generates a M$^{th}$ wait signal in response to the first to (M+1)$^{th}$ signals;
    first to (M−2)$^{th}$ pass gates, which receive the third to M$^{th}$ wait signals, respectively, are enabled or disabled in response to the latency control signals, and output the third to M$^{th}$ wait signals that are received when being enabled, respectively; and
    an output logic circuit that outputs the strobe control signal in response to one of the first to (M−2)$^{th}$ wait signals received from the output node, one of the third to M$^{th}$ wait signals, the internal write control signal and the last column detection signal.

23. The pseudo SRAM as claimed in claim 7, wherein the word line controller includes:
    a first word line control circuit that generates the first internal control signal in response to the address shift detection signal, the first detection signal and the second internal control signal; and
    a second word line control circuit that generates the word line control signal in response to the second control signal and the precharge control signal.

24. The pseudo SRAM as claimed in claim 23, wherein the first word line control circuit outputs the first internal control signal as a logic high during a set time when the first detection signal is a high level, and
    the second word line control circuit outputs the word line control signal as a high pulse signal when both the first internal control signal and the precharge control signal are a high level.

25. A pseudo SRAM comprising:
    a memory cell array including a plurality of DRAM cells;
    a burst mode controller that generates burst address signals and internal control response to an external clock signal, external control signals, external address signals, a precharge control signal and latency control signals so that data is read from some of the plurality of DRAM cells in burst mode or are written into some of the plurality of DRAM cells in burst mode; and
    a peripheral circuit that reads the data from some of the plurality of DRAM cells in burst mode or writes the data into some of the plurality of DRAM cells in burst mode in response to the burst address signals and the internal control signals,
    wherein the burst address signals include burst row address signals and burst column address signals, and
    the burst mode controller continuously generates the burst row address signals and the burst column address signals based on the external address signals and generates a burst operation control signal and a word line control signal in response to the external control signals, the precharge control signal and the latency control signals.

26. The pseudo SRAM as claimed in claim 25, wherein the peripheral circuit includes a read and write controller that generates a driver control signal in response to the word line control signal and the precharge control signal;

a row decoder that decodes the burst row address signals;

a word line driver that enables one a plurality of word lines of the memory cell array, which corresponds to the result decoded by the row decoder, in response to the driver control signal, or disables the plurality word lines of the memory cell array; and a column decoder that receives the burst column address signals in response to the burst operation control signal and enables bit lines of the memory cell array, which correspond to the burst column address signals.

27. The pseudo SRAM as claimed in claim 25, wherein the external control signals include an address valid signal, a chip select signal, a write enable signal and an output enable signal, wherein the address valid signal is disabled when the external address signals are input to the burst mode controller, and the burst mode controller receives the external address signals when the chip select signal and the address valid signal are disabled, and generates the burst row address signals and the burst column address signals which gradually rise from the external address signals.

28. The pseudo SRAM as claimed in claim 27, wherein the burst mode controller further includes a main controller that generates a first internal control signal in response to the external control signals, the precharge control signal and the latency control signals, generates the precharge control signal in response to the external control signals and the first internal control signal, and generates a mode register setting signal in response to the external control signals and the external address signals.

29. The pseudo SRAM as claimed in claim 28, further comprising a mode register that generates the latency control signals corresponding to a mode set by the mode register setting signal and the external address signals.

30. The pseudo SRAM as claimed in claim 28, wherein the main controller generates the precharge control signal as a high pulse signal after a set time elapses when the chip select signal and the address valid signal are disabled, and generates the precharge control signal as a high pulse signal when the first internal control signal becomes logic high.

31. The pseudo SRAM as claimed in claim 30, wherein the read and write controller enables the driver control signal when the word line control signal is enabled, and disables the driver control signal when the precharge control signal is enabled, and the word line driver enables one of a plurality of word lines of the memory cell array, which corresponds to the result decoded by the row decoder, whenever the driver control signal is enabled, and disables the plurality of word lines of the memory cell array when the driver control signal is disabled.

32. The pseudo SRAM as claimed in claim 27, wherein the burst mode controller includes:

a buffer unit that generates first and second control signals, an address shift detection signal, an internal clock signal, an internal write control signal, an internal address valid signal, the burst row address signals and the burst column address signals in response to the external clock signal, the external control signals and the external address signals;

a column address detector that receives the internal clock signal, the internal write control signal, the internal address valid signal, the latency control signals and the burst column address signals, determines whether the burst column address signals represent a last column address, and generates a first detection signal and a second detection signal according to the determination result;

a burst operation controller that generates the burst operation control signal in response to the first and second control signals, the internal clock signal, the internal write control signal, the internal address valid signal, the first detection signal, the second detection signal and the latency control signals; and a word line controller that generates a first internal control signal and the word line control signal in response to the address shift detection signal, the first detection signal, the second control signal and the precharge control signal.

33. The pseudo SRAM as claimed in claim 32, wherein the buffer unit includes:

an internal clock generating circuit that delays the external clock signal for a first predetermined time and generates a delayed signal, and delays the delayed signal for a second predetermined time to output the internal clock signal;

a control signal generating circuit that outputs the first and second control signals, the internal address valid signal and the internal write control signal in response to the external clock signal, the delayed signal, the chip select signal, the address valid signal and the write enable signal;

an address buffer that outputs internal row address signals, internal column address signals and the address shift detection signal in response to the chip select signal, the address valid signal, the internal clock signal and the external address signals; and an address counter that outputs the burst row address signals and the burst column address signals in response to the internal clock signal, the internal row address signals and the internal column address signals.

34. The pseudo SRAM as claimed in claim 32, wherein the column address detector includes:

a control clock generating circuit that generates one of a read clock signal and a write clock signal and a control clock signal in response to the internal clock signal and the internal write control signal;

a last column detection circuit that outputs a valid shift detection signal and an internal detection signal in response to the internal address valid signal and the burst column address signals;

a first detection signal generator that outputs the first detection signal and an output signal in response to one of the read clock signal and the write clock signal, the control clock signal, the latency control signals, the internal detection signal and the valid shift detection signal; and a second detection signal generator that outputs the second detection signal in response to one of the read clock signal and the write clock signal, the control clock signal, the latency control signals, the valid shift detection signal and the output signal.

35. A pseudo SRAM comprising:

a memory cell array including a plurality of DRAM cells;

a burst mode controller that generates burst row address signals, burst column address signals, a burst operation control signal and a word line control signal so that data are read from some of the plurality of DRAM cells in burst mode or are written into some of the plurality of DRAM cells in burst mode;

a read and write controller that generates a driver control signal in response to the word line control signal and the precharge control signal;

a row decoder that decodes the burst row address signals;
a word line driver that enables one of a plurality of word lines of the memory cell array, which corresponds to the result decoded by the row decoder or disables the plurality of word lines of the memory cell array, in response to the driver control signal; and
a column decoder that receives the burst column address signals in response to the burst operation control signal and enables bit lines of the memory cell array, which correspond to the burst column address signals,
wherein the burst mode controller includes:
a buffer unit that generates first and second control signals, an address shift detection signal, an internal clock signal, an internal write control signal, an internal address valid signal, the burst row address signals and the burst column address signals in response to an external clock signal, external control signals and external address signals;
a column address detector that receives the internal clock signal, the internal write control signal, the internal address valid signal, latency control signals and the burst column address signals, determines whether the burst column address signals represent a last column address, and generates a first detection signal and a second detection signal according to the determination;
a burst operation controller that generates the burst operation control signal in response to the first and second control signals, the internal clock signal, the internal write control signal, the internal address valid signal, the first detection signal, the second detection signal and the latency control signals; and
a word line controller that generates a first internal control signal and the word line control signal in response to the address shift detection signal, the first detection signal, the second control signal and the precharge control signal.

36. The pseudo SRAM as claimed in claim 35, wherein the external control signals include an address valid signal, a chip select signal, a write enable signal and an output enable signal,
wherein the address valid signal is disabled when the external address signals are input to the burst mode controller, and
the burst mode controller receives the external address signals when the chip select signal and the address valid signal are disabled, generates the burst row address signals and the burst column address signals which gradually rise from the external address signals, and continuously generates the burst row address signals and the burst column address signals until the address valid signal is again disabled or the chip select signal is enabled.

37. The pseudo SRAM as claimed in claim 36, wherein the burst mode controller further includes a main controller that generates the precharge control signal in response to the external control signals and the first internal control signal, and generates a mode register setting signal in response to the external control signals and the external address signals.

38. The pseudo SRAM as claimed in claim 37, further comprising a mode register that generates the latency control signals corresponding to a mode set by the mode register setting signal and the external address signals.

39. The pseudo SRAM as claimed in claim 37, wherein the main controller generates the precharge control signal as a high pulse signal after a set time elapses when the chip select signal and the address valid signal are disabled, and generates the precharge control signal as a high pulse signal when the first internal control signal becomes logic high.

40. The pseudo SRAM as claimed in claim 39, wherein the read and write controller enables the driver control signal when the word line control signal is enabled, and disables the driver control signal when the precharge control signal is enabled, and
the word line driver enables one of a plurality of word lines of the memory cell array, which corresponds to a result decoded by the row decoder, whenever the driver control signal is enabled, and disables the plurality of word lines of the memory cell array when the driver control signal is disabled.

41. The pseudo SRAM as claimed in claim 36, wherein the buffer unit includes:
an internal clock generating circuit that delays the external clock signal for a first predetermined time and generates a delayed signal, and delays the delayed signal for a second predetermined time to output the internal clock signal;
a control signal generating circuit that outputs the first and second control signals, the internal address valid signal and the internal write control signal in response to the external clock signal, the delayed signal, the chip select signal, the address valid signal and the write enable signal;
an address buffer that outputs internal row address signals, internal column address signals and the address shift detection signal in response to the chip select signal, the address valid signal, the internal clock signal and the external address signals; and
an address counter that outputs the burst row address signals and the burst column address signals in response to the internal clock signal, the internal row address signals and the internal column address signals.

42. The pseudo SRAM as claimed in claim 35, wherein the column address detector includes:
a control clock generating circuit that generates one of a read clock signal and a write clock signal and a control clock signal in response to the internal clock signal and the internal write control signal;
a last column detection circuit that outputs a valid shift detection signal and an internal detection signal in response to the internal address valid signal and the burst column address signals;
a first detection signal generator that outputs the first detection signal and an output signal in response to one of the read clock signal and the write clock signal, the control clock signal, the latency control signals, the internal detection signal and the valid shift detection signal; and
a second detection signal generator that outputs the second detection signal in response to one of the read clock signal and the write clock signal, the control clock signal, the latency control signals, the valid shift detection signal and the output signal.

43. A method of controlling a burst mode operation of a pseudo SRAM, the method comprising the steps of:
receiving external address signals in response to an external clock signal and external control signals and continuously generating burst row address signals and burst column address signals that gradually rise from the external address signals;
generating a burst operation control signal and a word line control signal in response to the external control signals, a precharge control signal and latency control signals;
generating a driver control signal in response to the word line control signal and the precharge control signal;
decoding the burst row address signals;

enabling one of a plurality of word lines of a memory cell array, which corresponds to a decoded result, in response to the driver control signal; and receiving the burst column address signals in response to the burst operation control signal and enabling bit lines of the memory cell array, which correspond to the burst column address signals.

44. The method as claimed in claim 43, wherein the external control signals include an address valid signal, a chip select signal, a write enable signal and an output enable signal, and wherein the address valid signal is disabled for a set time when the external address signals are received, and the chip select signal is disabled while the pseudo SRAM is enabled.

45. The method as claimed in claim 44, further comprising:

generating the precharge control signal as a pulse signal form after a set time elapses when the chip select signal and the address valid signal are disabled, or generating the precharge control signal in the pulse signal form when the first internal control signal becomes logic high;

outputting a mode register setting signal in response to the external control signals and the external address signals; and generating the latency control signals corresponding to a mode that is set by the mode register setting signal and the external address signals.

46. The method as claimed in claim 45, wherein in the step of generating the burst operation control signal and the word line control signal, the word line control signal is a pulse signal that is periodically generated in response to the external control signals, the precharge control signal and the latency control signals until the address valid signal is disabled again or the chip select signal is enabled, the step of generating the driver control signal includes:

enabling the driver control signal whenever the word line control signal is periodically generated; and disabling the driver control signal whenever the precharge control signal is generated, wherein a time point where the word line control signal is generated and a time point where the precharge control signal is generated are different from each other.

47. The method as claimed in claim 46, further comprising disabling a plurality of word lines of the memory cell array when the driver control signal is disabled, and in the step of enabling one of the word lines of the memory cell array, which corresponds to the decoded result, the word lines are enabled one by one according to the decoded result whenever the driver control signal is enabled.

48. The method as claimed in claim 45, wherein the step of generating the burst operation control signal and the word line control signal includes:

generating the first and second control signals, the address shift detection signal, the internal clock signal, the internal write control signal and the internal address valid signal in response to the external clock signal, the external control signals and the external address signals;

determining whether the burst column address signals represent a last column address based on the internal clock signal, the internal write control signal, the internal address valid signal, the latency control signals and the burst column address signals, and generating a first detection signal and a second detection signal according to the determination;

generating the burst operation control signal in response to the first and second control signals, the internal clock signal, the internal write control signal, the internal address valid signal, the first detection signal, the second detection signal and the latency control signals; and generating the first internal control signal and the word line control signal in response to the address shift detection signal, the first detection signal, the second control signal and the precharge control signal.

49. The method as claimed in claim 48, wherein the step of generating the first and second control signals, the address shift detection signal, the internal clock signal, the internal write control signal and the internal address valid signal includes:

delaying the external clock signal for a first predetermined time and generating a delayed signal;

delaying the delayed signal for a second predetermined time and generating the internal clock signal;

outputting the first and second control signals, the internal address valid signal and the internal write control signal in response to the external clock signal, the delayed signal, the chip select signal, the address valid signal and the write enable signal; and outputting internal row address signals, internal column address signals and the address shift detection signal in response to the chip select signal, the address valid signal, the internal clock signal and the external address signals.

50. The method as claimed in claim 49, wherein in the step of continuously generating the burst row address signals and the burst column address signals, the burst row address signals are generated based on the internal clock signal and the internal row address signals, and the burst column address signals are generated based on the internal clock signal and the internal column address signals.

51. The method as claimed in claim 48, wherein the step of generating the first and second detection signals includes:

generating any one of a read clock signal and a write clock signal and a control clock signal in response to the internal clock signal and the internal write control signal;

outputting a valid shift detection signal and an internal detection signal in response to the internal address valid signal and the burst column address signals;

outputting the first detection signal and an output signal in response to any one of the read clock signal and the write clock signal, the control clock signal, the latency control signals, the internal detection signal and the valid shift detection signal; and outputting the second detection signal in response to any one of the read clock signal and the write clock signal, the control clock signal, the latency control signals, the valid shift detection signal and the output signal.

52. The method as claimed in claim 51, wherein in the step of outputting the valid shift detection signal and the internal detection signal, when the internal address valid signal is a logic low and when the burst column address signals are all logic high, the internal detection signal becomes logic high, and in the step of outputting the first detection signal and the output signal, when the internal detection signal is a logic high, the first detection signal is output as a high pulse signal and the output signal is output as a logic high in synchronization with any one of the read clock signal and the write clock signal after a first predetermined time elapses in response to the latency control signals.

53. The method as claimed in claim 52, wherein when the write enable signal is disabled, the internal write control signal is disabled, and when the write enable signal is enabled, the internal write control signal is enabled, and the step of generating any one of the read clock signal and the write clock signal, and the control clock signal includes:

delaying the internal clock signal for a predetermined time and outputting the delayed signal as the control clock signal;

generating the write clock signal in synchronization with the control clock signal when the internal write control signal becomes disabled; and generating the read clock signal in synchronization with the control clock signal when the internal write control signal becomes enabled.

54. The method as claimed in claim 51, wherein the step of outputting the first detection signal and the output signal includes the step of:

generating a first shift signal in response to the internal detection signal, the valid shift detection signal and the control clock signal;

receiving first to $(J-1)^{th}$ (J is an integer) shift signals, respectively, and outputting the second to $J^{th}$ shift signals, respectively, in response to the valid shift detection signal and the control clock signal;

outputting one of the first to $J^{th}$ shift signals to an output node in response to the latency control signals;

outputting the output signal in response to one of the first to $J^{th}$ shift signals received from the output node, the valid shift detection signal and the control clock signal;

outputting a $(J+1)^{th}$ shift signal in response to one of the first to $J^{th}$ shift signals received from the output node, the valid shift detection signal and the control clock signal;

outputting a $(J+2)^{th}$ shift signal in response to the $(J+1)^{th}$ shift signal, the valid shift detection signal and the control clock signal; and outputting the $(J+2)^{th}$ shift signal as the first detection signal in response to the read clock signal, or outputting one of the first to $J^{th}$ shift signals received from the output node as the first detection signal in response to the write clock signal.

55. The method as claimed in claim 51, wherein the step of outputting the second detection signal includes the steps of:

generating a first shift signal in response to the output signal, the valid shift detection signal and the control clock signal;

receiving the first to $(L-1)^{th}$ (L is an integer) shift signals, respectively, and outputting the second to $L^{th}$ shift signals, respectively, in response to the valid shift detection signal and the control clock signal;

outputting one of the second to $L^{th}$ shift signals to an output node in response to the latency control signals;

outputting a $(L+1)^{th}$ shift signal in response to one of the second to $L^{th}$ shift signals received from the output node, the valid shift detection signal and the control clock signal;

outputting a $(L+2)^{th}$ shift signal in response to the $(L+1)^{th}$ shift signal, the valid shift detection signal and the control clock signal; and outputting one of the second to $L^{th}$ shift signals received from the output node as the second detection signal in response to the read clock signal, or outputting the $(L+2)^{th}$ shift signal as the second detection signal in response to the write clock signal.

56. The method as claimed in claim 48, wherein the step of generating the burst operation control signal includes the steps of:

generating a strobe control signal in response to the second control signal, the internal clock signal, the internal write control signal, the internal address valid signal, the first detection signal, the second detection signal and the latency control signals; and generating the burst operation control signal in response to the first and second control signals and the strobe control signal.

57. The method as claimed in claim 56, wherein in the step of generating the strobe control signal, the strobe control signal is enabled when the second detection signal is a high level, or the strobe control signal is enabled after a set time elapses when the internal address valid signal is a high level, and the strobe control signal is disabled when the first detection signal is a high level, in the step of generating the burst operation control signal, when the strobe control signal is enabled, a high pulse signal, which is periodically repeated, is generated as the burst operation control signal in response to the first and second control signals, and in the step of enabling of the bit line(s) of the memory cell array, whenever the burst operation control signal is generated as a high pulse signal, the bit lines(s) of the memory cell array, which correspond to the burst column address signals, are enabled.

58. The method as claimed in claim 56, wherein the steps of generating the strobe control signal include:

generating latch signals in response to the internal clock signal and the internal address valid signal;

outputting a last column detection signal in response to the internal address valid signal, the first and second detection signals and the second control signal; and outputting the strobe control signal in response to the internal write control signal, the latch signals, the latency control signals and the last column detection signal.

59. The method as claimed in claim 58, wherein the steps of generating the latch signals includes the steps of:

outputting a first shift signal and a first latch signal in response to an inverted signal of the internal address valid signal and an inverted signal of the internal clock signal;

receiving first to $(M-1)^{th}$ (M is an integer) shift signals, respectively, and outputting second to $M^{th}$ shift signals and second to $M^{th}$ latch signals, respectively, in response to the inverted signal of the internal clock signal; and outputting a $(M+1)^{th}$ latch signal in response to the $M^{th}$ shift signal and the inverted signal of the internal clock signal.

60. The method as claimed in claim 59, wherein the steps of generating the strobe control signal include:

generating first to $(M-2)^{th}$ wait signals, respectively, in response to the first to $(M-1)^{th}$ latch signals;

outputting one of the first to $(M-2)^{th}$ wait signals to an output node in response to the latency control signals;

generating a $(M-1)^{th}$ wait signal in response to the first to $M^{th}$ latch signals;

generating a $M^{th}$ wait signal in response to the first to $(M+1)^{th}$ latch signals;

outputting one of the third to $M^{th}$ wait signals in response to the latency control signals; and outputting the strobe control signal in response to one of the first to $(M-2)^{th}$ signals received from the output node, one of the third to $M^{th}$ wait signals, the internal write control signal and the last column detection signal.

* * * * *